(12) United States Patent
Shchegrov et al.

(10) Patent No.: US 11,713,959 B2
(45) Date of Patent: Aug. 1, 2023

(54) OVERLAY METROLOGY USING SPECTROSCOPIC PHASE

(71) Applicant: KLA Corporation, Milpitas, CA (US)

(72) Inventors: Andrei V. Shchegrov, Campbell, CA (US); Ido Dolev, Milpitas, CA (US); Yoram Uziel, Milpitas, CA (US); Amnon Manassen, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/204,595

(22) Filed: Mar. 17, 2021

(65) Prior Publication Data

US 2022/0299308 A1 Sep. 22, 2022

(51) Int. Cl.
*G01B 9/02001* (2022.01)
*G01B 11/27* (2006.01)

(52) U.S. Cl.
CPC .......... *G01B 9/0201* (2013.01); *G01B 11/272* (2013.01)

(58) Field of Classification Search
CPC ............ G03F 7/70633; G01B 9/02044; G01B 9/0201
See application file for complete search history.

(56) References Cited

U.S. PATENT DOCUMENTS

| | | | |
|---|---|---|---|
| 5,608,526 A | 3/1997 | Piwonka-Corle et al. | |
| 5,859,424 A | 1/1999 | Norton et al. | |
| 7,478,019 B2 | 1/2009 | Zangooie et al. | |
| 7,933,026 B2 | 4/2011 | Opsal et al. | |
| 9,909,983 B2 | 3/2018 | Pandey | |
| 10,352,876 B2 | 7/2019 | Shchegrov et al. | |
| 10,769,320 B2 | 9/2020 | Kuznetsov et al. | |
| 2008/0049233 A1* | 2/2008 | De Groot | G01B 9/02044 356/511 |
| 2009/0262362 A1 | 10/2009 | Groot et al. | |
| 2012/0069326 A1 | 3/2012 | Lega et al. | |

(Continued)

FOREIGN PATENT DOCUMENTS

KR 1020070015310 A 2/2007

OTHER PUBLICATIONS

International Search Report and Written Opinion in PCT/US2022/017785 dated Jun. 7, 2022, 10 pages.

*Primary Examiner* — Michael A Lyons
(74) *Attorney, Agent, or Firm* — Suiter Swantz pc llo

(57) ABSTRACT

An interferometric overlay tool may include an interferometer and a controller. The interferometer may include one or more beamsplitters to split illumination including one or more wavelengths into a probe beam along a probe path and a reference beam along a reference path, one or more illumination optics to illuminate a grating-over-grating structure with the probe beam, one or more collection optics to collect a measurement beam from the grating-over-grating structure, one or more beam combiners to combine the measurement beam and the reference beam as an interference beam, and a variable phase delay configured to vary an optical path difference (OPD) in the interferometer. The controller may receive one or more interference signals representative of interferometric phase data associated with a plurality of OPD values and the one or more wavelengths from a detector and determine an overlay error of the grating-over-grating structure based on the interferometric phase data.

37 Claims, 13 Drawing Sheets

(56) References Cited

U.S. PATENT DOCUMENTS

2015/0323316 A1 11/2015 Shchegrov et al.
2017/0177760 A1* 6/2017 Socha ..................... G06F 17/18
2020/0074617 A1* 3/2020 Zeng .................... G01N 21/956

* cited by examiner

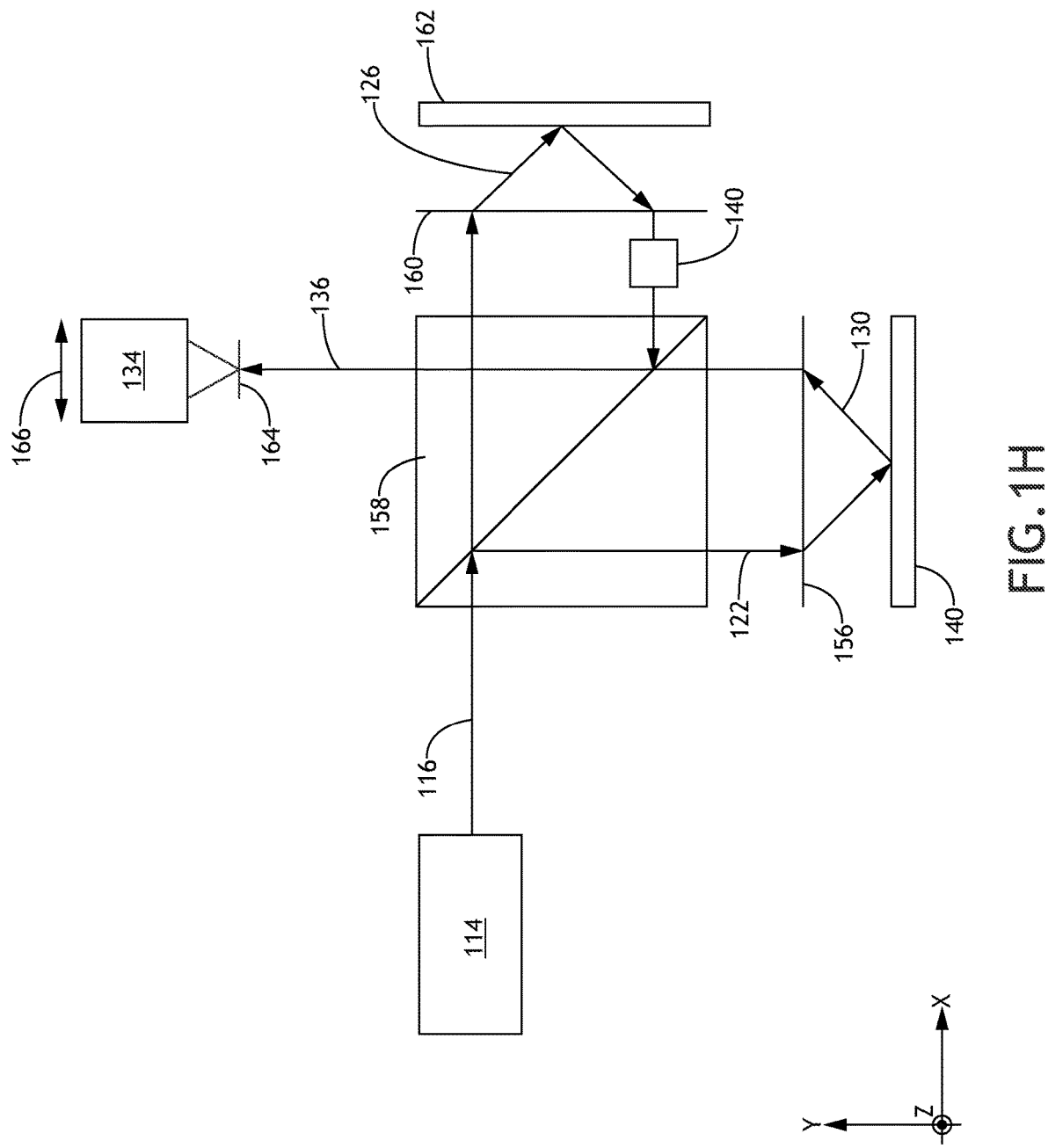

OVERLAY METROLOGY USING SPECTROSCOPIC PHASE

TECHNICAL FIELD

The present disclosure relates generally to overlay metrology and, more particularly, to overlay metrology based on spectroscopic phase information from an overlay target.

BACKGROUND

Overlay metrology systems typically characterize the overlay alignment of multiple layers of a sample by measuring the relative positions of overlay target features located on layers of interest. As the size of fabricated features decreases and the feature density increases, the demands on overlay metrology systems needed to characterize these features increase.

Device structures or overlay targets having device-scale features may typically include features that are unresolvable at optical wavelengths used in many overlay metrology systems. Accordingly, overlay measurements are commonly performed on dedicated overlay targets having features designed for sensitive overlay measurements rather than directly on device features. However, differences in size, orientation, density, and/or location on the sample of overlay targets relative to the device features may introduce a mismatch between measured overlay at the target and actual overlay of device features. Therefore, it is desirable to provide systems and methods that cure the above deficiencies.

SUMMARY

An interferometric overlay tool is disclosed in accordance with one or more illustrative embodiments of the present disclosure. In one illustrative embodiment, the interferometric overlay tool includes an interferometer. In another illustrative embodiment, the interferometer includes one or more beamsplitters to split illumination from an illumination source into a probe beam along a probe path and a reference beam along a reference path, the illumination including one or more selected wavelengths. In another illustrative embodiment, the interferometer includes one or more illumination optics to illuminate a grating-over-grating structure with the probe beam, and the grating-over-grating structure is associated with two or more at least partially overlapping lithographic exposure fields. In another illustrative embodiment, the interferometer includes one or more collection optics to collect a measurement beam from the grating-over-grating structure. In another illustrative embodiment, the interferometer includes one or more beam combiners to combine the measurement beam and the reference beam as an interference beam. In another illustrative embodiment, the interferometer includes a variable phase delay configured to vary an optical path difference (OPD) between the probe path and the reference path. In another illustrative embodiment, the interferometric overlay tool includes a controller communicatively coupled to the interferometer. In another illustrative embodiment, the controller receives one or more interference signals from a detector, where the detector is positioned to capture the interference beam, wherein the one or more interference signals are representative of interferometric phase data associated with a plurality of OPD values and the one or more wavelengths of illumination. In another illustrative embodiment, the controller determines an overlay error of the grating-over-grating structure based on the interferometric phase data.

An interferometric overlay metrology tool is disclosed in accordance with one or more illustrative embodiments of the present disclosure. In one illustrative embodiment, the interferometric overlay metrology tool includes an illumination source to generate broadband illumination. In another illustrative embodiment, the interferometric overlay metrology tool includes an interferometer. In another illustrative embodiment, the interferometer includes one or more beamsplitters to split the broadband illumination into a probe beam along a probe path and a reference beam along a reference path, where the illumination includes one or more selected wavelengths and where the probe beam and the reference beam are extended along an expansion direction. In another illustrative embodiment, the interferometer includes one or more illumination optics to illuminate a grating-over-grating structure with the probe beam, where the grating-over-grating structure is associated with two or more at least partially overlapping lithographic exposure fields. In another illustrative embodiment, the interferometer includes one or more collection optics to collect a measurement beam from the grating-over-grating structure. In another illustrative embodiment, the interferometer includes one or more beam combiners to combine the measurement beam and the reference beam as an interference beam. In another illustrative embodiment, the interferometer includes a variable phase delay configured to vary an optical path difference (OPD) between the probe path and the reference path, where the variable phase delay induces a plurality of values of the OPD along the expansion direction. In another illustrative embodiment, the interferometric overlay metrology tool includes a spectroscopic detector including one or more dispersive elements to spectrally disperse the interference beam along a dispersion direction orthogonal to the expansion direction, wherein the spectroscopic detector includes a two-dimensional sensor to generate an interference signal representative of interferometric phase data associated with the plurality of OPD values and the one or more wavelengths of illumination, where the plurality of OPD values are distributed along the expansion direction of the two-dimensional sensor and the one or more wavelengths of illumination are distributed along the dispersion direction. In another illustrative embodiment, the interferometric overlay metrology tool includes a controller communicatively coupled to the spectroscopic detector. In another illustrative embodiment, the controller receives the interference signal from the spectroscopic detector, wherein the interference signal is representative of interferometric phase data associated with the plurality of OPD values and the one or more wavelengths of illumination. In another illustrative embodiment, the controller determines an overlay error of the grating-over-grating structure based on the interferometric phase data.

An overlay metrology method is disclosed in accordance with one or more illustrative embodiments of the present disclosure. In one illustrative embodiment, the method includes generating training interferometric phase data for a plurality of training grating-over-grating structures associated with two or more at least partially overlapping lithographic exposure fields with known overlay errors, where the training interferometric phase data is associated with interferometric measurements of the plurality of training grating-over-grating structures using an interferometric metrology tool providing one or more wavelengths of illumination and including a variable phase delay configured to vary an optical path difference (OPD) between a probe path and a reference path of the interferometric metrology tool. In another illustrative embodiment, the method includes training an overlay model with the training phase data to provide an overlay measurement based on input phase data. In another illustrative embodiment, the method includes generating test phase data for one or more test grating-over-grating structures formed from two or more at least partially overlapping lithographic exposures with unknown overlay errors located on one or more test samples using the interferometric metrology tool. In another illustrative embodiment, the method includes generating overlay measurements for the one or more test grating-over-grating structures with the trained overlay model using the test phase data as the input phase data.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 1H is a conceptual side view of the interferometer of FIG. 1E illustrating a configuration in which the detector includes a dispersive element to generate spectroscopic phase data, in accordance with one or more embodiments of the present disclosure.

DETAILED DESCRIPTION

Figure 1A:
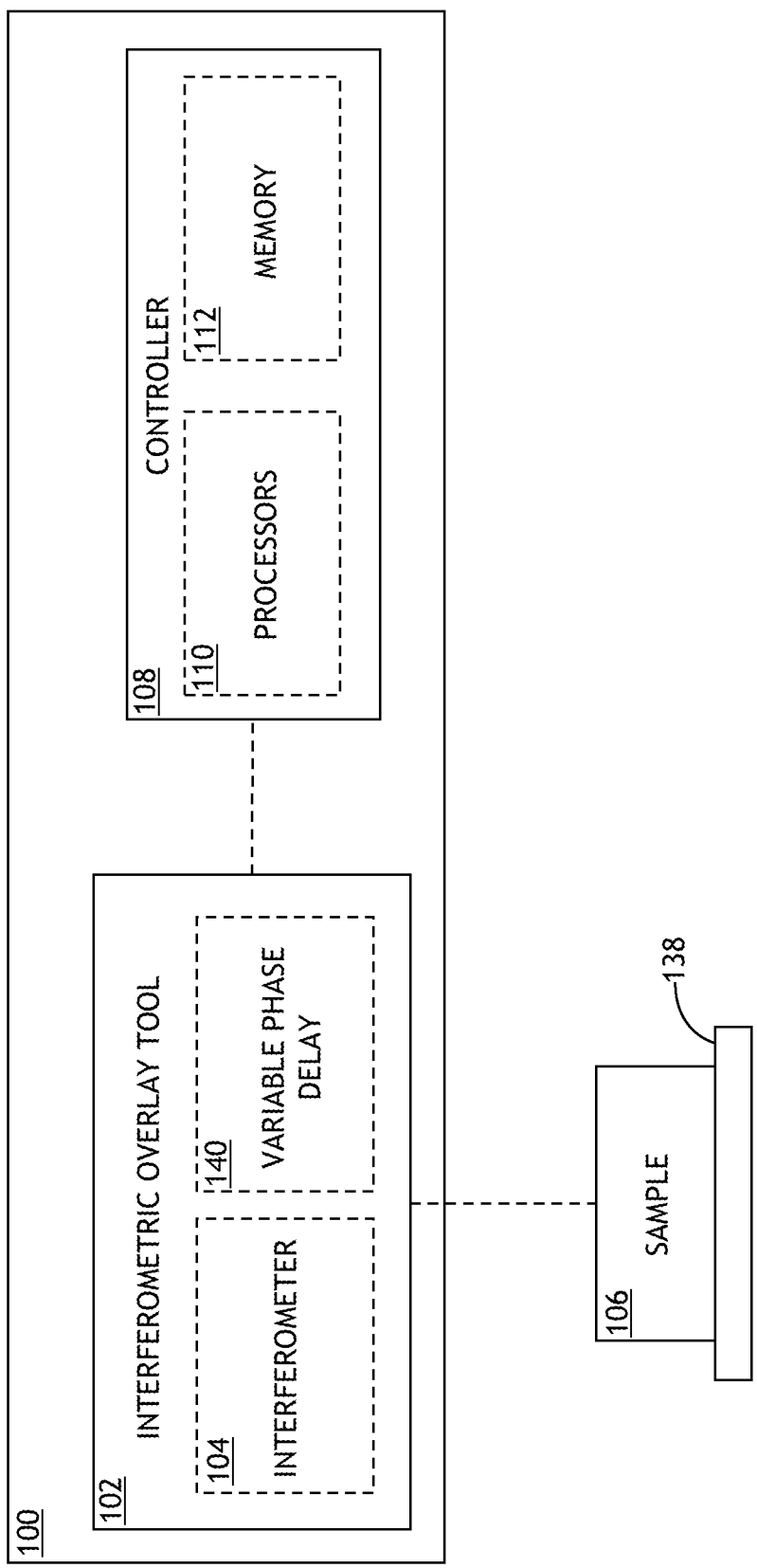
FIG. 1A is a block diagram view of an interferometric overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for model-based scatterometry overlay measurements of grating-over-grating structures based at least in part on phase information induced by constituent gratings in the grating-over-grating structures.

The term overlay is generally used herein to describe relative positions of features on a sample fabricated by two or more lithographic patterning steps, where the term overlay error describes a deviation of the features from a nominal arrangement. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Accordingly, for the purposes of the present disclosure, a grating-over-grating structure may generally refer to a structure having periodic structures formed in an overlapping region of the sample from two or more different lithographic exposure fields. For example, a grating-over-grating structure may include periodic structures on two or more sample layers in overlapping regions. Further, the features on each layer of the grating-over-grating structure may be associated with any step of a fabrication process such as, but not limited to, after-etch features, after-development features, or after-cleaning features. For instance, a grating-over-grating structure may include patterned features on multiple layers associated with lithographic exposure fields on the multiple layers and one or more additional processing steps (e.g., etching, cleaning, or the like) on any of the layers. In another instance, a grating-over-grating structure may include patterned features associated with a first lithographic exposure field on a first layer and one or more additional processing steps and lithographically exposed features on a second layer associated with a second lithographic exposure field. In this way, the second-layer features may be resist-layer features. By way of another example, a grating-over-grating structure may include periodic structures on a single layer in a common region of the sample associated with two or more lithographic exposures of that common region on the single layer (e.g., using a multiple patterning technique).

It is recognized herein that efficient and accurate overlay metrology may be performed by training an overlay model with raw scatterometry data associated with training targets with grating-over-grating structures having known overlay values and utilizing this model for overlay measurements of future targets with unknown overlay errors. For the purposes of the present disclosure, the term scatterometry metrology is used herein to broadly encompass the terms scatterometry-based metrology and diffraction-based metrology in which a sample having periodic features on one or more sample layers is illuminated with an illumination beam having a limited angular extent and an overlay measurement is generated based on reflected, scattered, and/or diffracted light. Scatterometry data may thus generally be obtained using various reflectometry and/or ellipsometry techniques. In this way, optical measurements may be made in which optical properties of incident and/or collected light such as, but not limited to, wavelength, angle, and polarization are controlled and/or varied. Further, scatterometry data may be generated based on measurements of any combination of reflected, diffracted, and/or scattered light. The process of training an overlay model may identify correlations between input scatterometry data and physical overlay on a sample such that a trained model may predict the physical overlay of a sample based on input scatterometry data. As an example, model-based scatterometry overlay using signal response metrology is generally described in U.S. Pat. No. 10,352,876 issued on Jul. 16, 2019, which is incorporated herein by reference in its entirety.

It is contemplated herein that overlay information associated with a grating-over-grating structure is also embedded in the reflected and/or diffracted light from the grating-over-grating structure via the phase differences between light reflected and/or diffracted from the two or more grating structures. Accordingly, some embodiments of the present disclosure are directed to interferometric phase measurements of grating-over-grating structures for overlay metrology. It is further contemplated herein that phase data may be incorporated into a scatterometry overlay model in a variety of ways. In one embodiment, a scatterometry overlay model directly relates phase data to overlay error. In another embodiment, spectral phase data is one of multiple inputs to a scatterometry overlay model. For example, a scatterometry overlay model may include a multi-parameter model that relates overlay error of a grating-over-grating structure to phase data as well as one or more additional parameters such as, but not limited to, illumination wavelength, illumination polarization, illumination angle, collection wavelength, collection polarization, or collection angle. Further, the scatterometry overlay model may be trained by generating training data for various combinations of the phase data and other selected optical parameters on training targets with known overlay errors. In this way, model-based scatterometry overlay techniques such as, but not limited to, those described in U.S. Pat. No. 10,352,876 referenced above and incorporated herein, may be extended to include phase information such as, but not limited to, spectroscopic phase information, associated with grating-over-grating structures in one or more layers of a sample.

In some embodiments, interferometry phase data is measured using an overlay metrology tool with an interferometer with a variable phase delay for varying or otherwise controlling an optical path difference (OPD) between a probe path and a reference path in the interferometer. For example, an illumination beam may be split into a probe beam along the probe path and a reference beam along the reference path. Further, a measurement beam along the probe path associated with reflected, diffracted, and/or scattered light from the grating-over-grating structure may by recombined with (e.g., interfered with) the reference beam on a detector. In this way, interferometric phase measurements may include one or more measurements associated with multiple values of the OPD.

Further, the variable phase delay may provide simultaneous or sequential measurements with multiple values of the OPD. For example, the variable phase delay may introduce a uniform OPD for all light within the interferometer and may sequentially vary this OPD. By way of another example, light in the interferometer may be spatially extended along an expansion direction (or a two-dimensional profile more generally) and the variable phase delay may introduce different values of the OPD along the expansion direction (or the two-dimensional profile). In this way, interferometric phase data associated with multiple OPD values may be simultaneously captured in a single measurement.

Additional embodiments are directed to overlay measurements based on spectral interferometric phase data generated at one or more OPD values. For example, spectral interferometric phase data may include spectra of the measurement light captured for multiple OPD values or interferometric phase measurements at multiple OPD values performed at different wavelengths. Spectral interferometric phase data may be generated sequentially or simultaneously. For example, spectral interferometric phase data may be captured by sequentially illuminating a grating-over-grating structure with narrowband light with different wavelengths and capturing the corresponding interferometric phase data. By way of another example, spectral interferometric phase data may be generated simultaneously for a particular OPD value using a spectroscopic detector. In some embodiments, spectral interferometric phase data associated with multiple OPD values may be generated in a single measurement using both a spectroscopic detector and a variable phase delay to simultaneously induce different OPD values across a beam profile of the light in the interferometer.

Additional embodiments of the present disclosure are directed to model-based scatterometry overlay in which an overlay measurement is based at least in part on spectral phase measurements of light reflected and/or diffracted from a grating-over grating structure including overlapping grating structures on one or more sample layers formed from two or more lithographic exposures of interest. For example, spectral phase data may include a measured spectrum from the grating-over-grating structure in response to illumination from a broadband illumination beam for one or more selected values of the OPD.

In some embodiments, a scatterometry overlay model is developed to relate phase measurements of grating-over-grating structures to overlay. For example, a scatterometry overlay model may be trained with phase data (e.g., training data) associated with a series of grating-over-grating structures with known overlay offsets (e.g., training targets). In this way, the scatterometry overlay model may be trained to identify correlations between overlay errors in grating-over-grating structures and wavelength-resolved phase data. Once trained, an overlay measurement of a test sample having an unknown overlay error may be determined by applying the trained scatterometry model to measurements of the phase of the test sample. Further, the training data may be associated with any combination of simulated data of simulated training targets or measurement data of fabricated training targets.

It is further contemplated herein that overlay measurements may generally be performed at any suitable location on a device. For example, overlay measurements may be performed directly on device features that include grating-over-grating structures, which may provide a direct measurement of device-relevant overlay. By way of another example, overlay measurements may be performed on dedicated overlay targets including grating-over-grating structures in one or more cells, where overlay measurements based on the overlay targets are designed to be representative of overlay errors of device features of interest on the sample. These overlay targets may be placed at various locations including within dies or in scribe lines between dies. Dedicated overlay targets may generally be designed for overlay measurements using a variety of techniques and may include device-scale features or larger features designed to be resolvable using optical techniques. However, it is contemplated herein that various differences between device features and overlay targets such as, but not limited to, physical separation, differences in feature pitch, or differences in process loading effects may introduce potential sources of error. Accordingly, in some embodiments, overlay measurements are performed directly on device features or on overlay targets having device-scale features (e.g., device rule targets). In this way, various sources of error associated with mismatches between feature sizes, densities, and/or orientations associated with overlay targets having larger-scale features may be avoided.

Referring now to FIGS. 1A-3B, systems and methods for model-based scatterometry overlay metrology using interferometric measurements are described in greater detail in accordance with one or more embodiments of the present disclosure.

FIG. 1A is a block diagram view of an interferometric overlay metrology system 100, in accordance with one or more embodiments of the present disclosure. In one embodiment, an interferometric overlay metrology system 100 includes an interferometric overlay tool 102 including an interferometer 104 for generating interferometric phase data associated with a sample 106.

In another embodiment, the interferometric overlay metrology system 100 includes a controller 108 with one or more processors 110 configured to execute program instructions maintained on a memory medium 112 (e.g., memory). In this regard, the one or more processors 110 of controller 108 may execute any of the various process steps described throughout the present disclosure. Further, the memory medium 112 may store any type of data for use by any component of the interferometric overlay metrology system 100. For example, the memory medium 112 may store recipes for the interferometric overlay tool 102, data generated by the interferometric overlay tool 102, determine overlay measurements based on data generated by the interferometric overlay tool 102, develop an overlay model for determining overlay based at least in part on interferometric phase data, train the overlay model with training data associated with one or more training samples having known overlay errors, or determine overlay on one or more test samples having unknown overlay errors based on measured interferometric phase data from the one or more test samples as inputs to the trained overlay model.

Figure 2A:
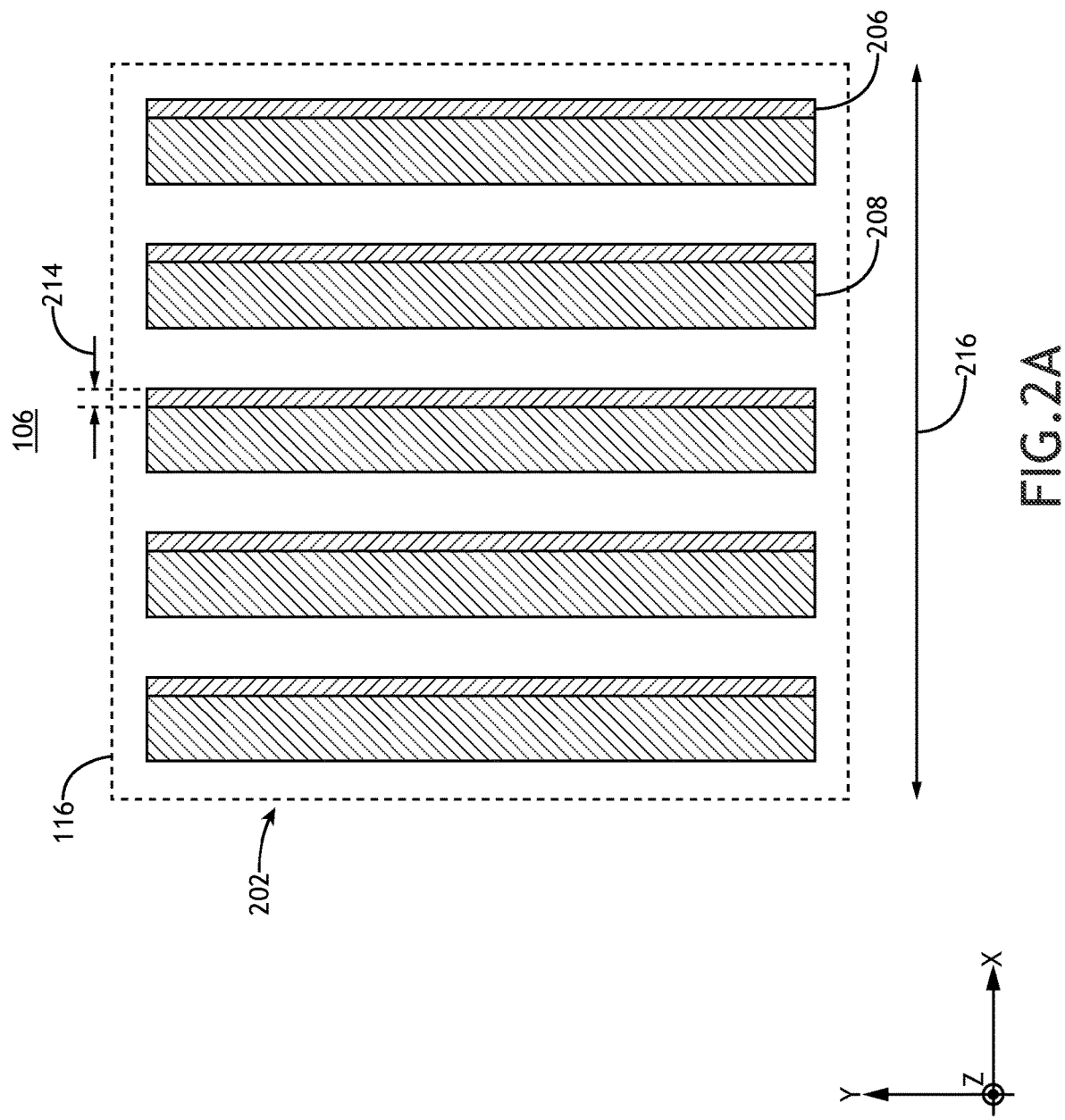
FIG. 2A is a top view of a grating-over-grating structure on two layers of the sample, in accordance with one or more embodiments of the present disclosure.
Figure 2B:
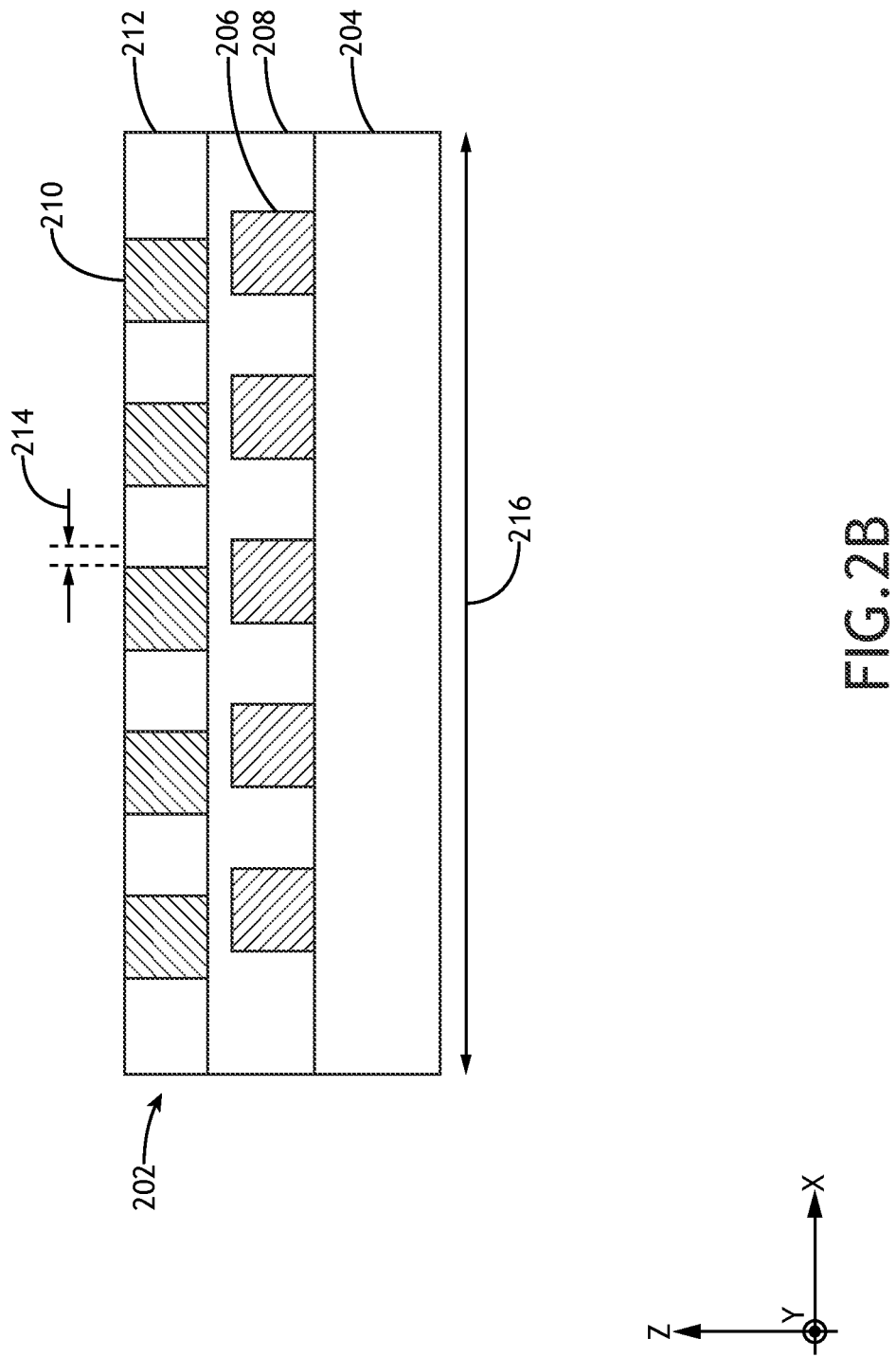
FIG. 2B is a side view of the grating-over-grating structure in FIG. 2A on a substrate, in accordance with one or more embodiments of the present disclosure.
Figure 2C:
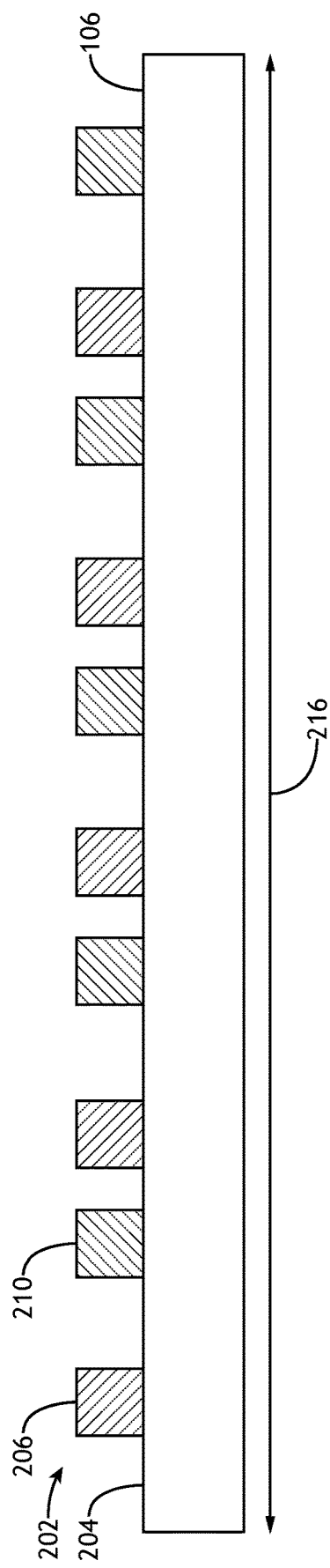
FIG. 2C is a side view of a grating-over-grating structure formed on a single layer of the sample, in accordance with one or more embodiments of the present disclosure.

FIGS. 2A-2C illustrate non-limiting examples of a grating-over-grating structure 202 in accordance with one or more embodiments of the present disclosure. It is contemplated herein that a grating-over-grating structure 202 suitable for providing overlay measurements based at least in part on interferometric phase data as disclosed herein may be located at any suitable location on a sample 106. In one embodiment, a grating-over-grating structure 202 is a part of or otherwise associated with device features on the sample 106. In this regard, the interferometric overlay tool 102 may directly characterize features of interest. In another embodiment, a grating-over-grating structure 202 is a part of or otherwise associated with an overlay target. For example, an overlay target may include one or more cells, each having grating-over-grating structures 202. Further, different cells or overlay targets may have grating-over-grating structures 202 with different characteristics such as, but not limited to, feature size, feature pitch, or direction of periodicity. For instance, an overlay target may include cells with grating-over-grating structures 202 having different intended offsets along a measurement direction 216 to facilitate sensitive overlay measurements based on the intentional asymmetry of each cell. In another instance, an overlay target may include cells with grating-over-grating structures 202 having different orientations (e.g., directions of periodicity) to facilitate overlay measurements along different directions.

In some embodiments, various characteristics of a grating-over-grating structure 202 are similar to device features of interest (e.g., are device-like targets). In this way, systematic errors associated with differences between the lithographic exposures (e.g., optical loading characteristics) of the device features and the overlay target may be minimized or otherwise controlled within selected tolerances. In some embodiments, various characteristics (e.g., feature size, feature pitch, or the like) of a grating-over-grating structure 202 are designed to facilitate overlay measurements longer-wavelength light (e.g., visible light or infrared light).

FIG. 2A is a top view of a grating-over-grating structure 202 on two layers of the sample 106, in accordance with one or more embodiments of the present disclosure. FIG. 2B is a side view of the grating-over-grating structure 202 in FIG. 2A on a substrate 204, in accordance with one or more embodiments of the present disclosure. In one embodiment, the grating-over-grating structure 202 includes first-exposure elements 206 located on a first layer 208 of the sample 106 and second-exposure elements 210 located on a second layer 212 of the sample 106 oriented such that the regions including the first-exposure elements 206 and the second-exposure elements 210 overlap to form a grating-over-grating structure 202. Further, the first-exposure elements 206 and the second-exposure elements 210 are illustrated with an offset 214 along the measurement direction 216 (e.g., here the X direction), which may correspond to an intended offset (e.g., a designed offset for the particular grating-over-grating structure 202), an overlay error, or a combination thereof.

As described previously herein, the first-exposure elements 206 and the second-exposure elements 210 of the grating-over-grating structure 202 may be associated with any step of the fabrication process. In one embodiment, both the first-exposure elements 206 and the second-exposure elements 210 are fully-formed patterned elements associated with multiple processing steps including a lithographic exposure on the first layer 208 and one or more additional processing steps such as, but not limited to, etching or cleaning. Such features may be, but are not required to be, referred to as after-etch features or after-cleaning features. In another embodiment, the second layer 212 is a resist layer and the second-exposure elements 210 are exposed features associated with patterns in the resist layer induced by a lithographic exposure. In this case, one or more additional unpatterned layers may be present between the first layer 208 and the second layer 212. Such layers may be patterned based on additional processing steps applied to the second-exposure elements 210.

FIG. 2C is a side view of a grating-over-grating structure 202 formed on a single layer of the sample 106, in accordance with one or more embodiments of the present disclosure. In this case, the first-exposure elements 206 and the second-exposure elements 210 may also be associated with any step of a fabrication process and may include exposure patterns in a resist layer or fully-developed patterns. As in FIGS. 2A and 2B, the first-exposure elements 206 and the second-exposure elements 210 are illustrated with the offset 214 along the measurement direction 216, which may correspond to an intended offset (e.g., a designed offset for the particular grating-over-grating structure 202), an overlay error, or a combination thereof.

It is to be understood, however, that the grating-over-grating structures 202 illustrated in FIGS. 2A-2C are provided solely for illustrative purposes and should not be interpreted as limiting. For example, the first-exposure elements 206 and the second-exposure elements 210 are illustrated as having substantially similar sizes, pitches, and orientations. However, in some embodiments, the size, pitch, and/or orientation of the first-exposure elements 206 and the second-exposure elements 210 may differ.

It is noted that regardless of the design of the grating-over-grating structure, a phase of measurement beam 130 may be related to the offset 214 between the first-exposure elements 206 and the second-exposure elements 210 along the measurement direction 216. Accordingly, an overlay model may be generated to relate overlay (or overlay error) to interferometric phase data associated with measurements of one or more grating-over-grating structures 202 on a sample 106 with one or more wavelengths of illumination. In this way, an overlay measurement of a test sample 106 having an unknown overlay value may be generated based on an overlay model trained with training data, which may be associated with previous measurements and/or simulations of phase data from grating-over-grating structures 202 with known overlay values.

Figure 1B:
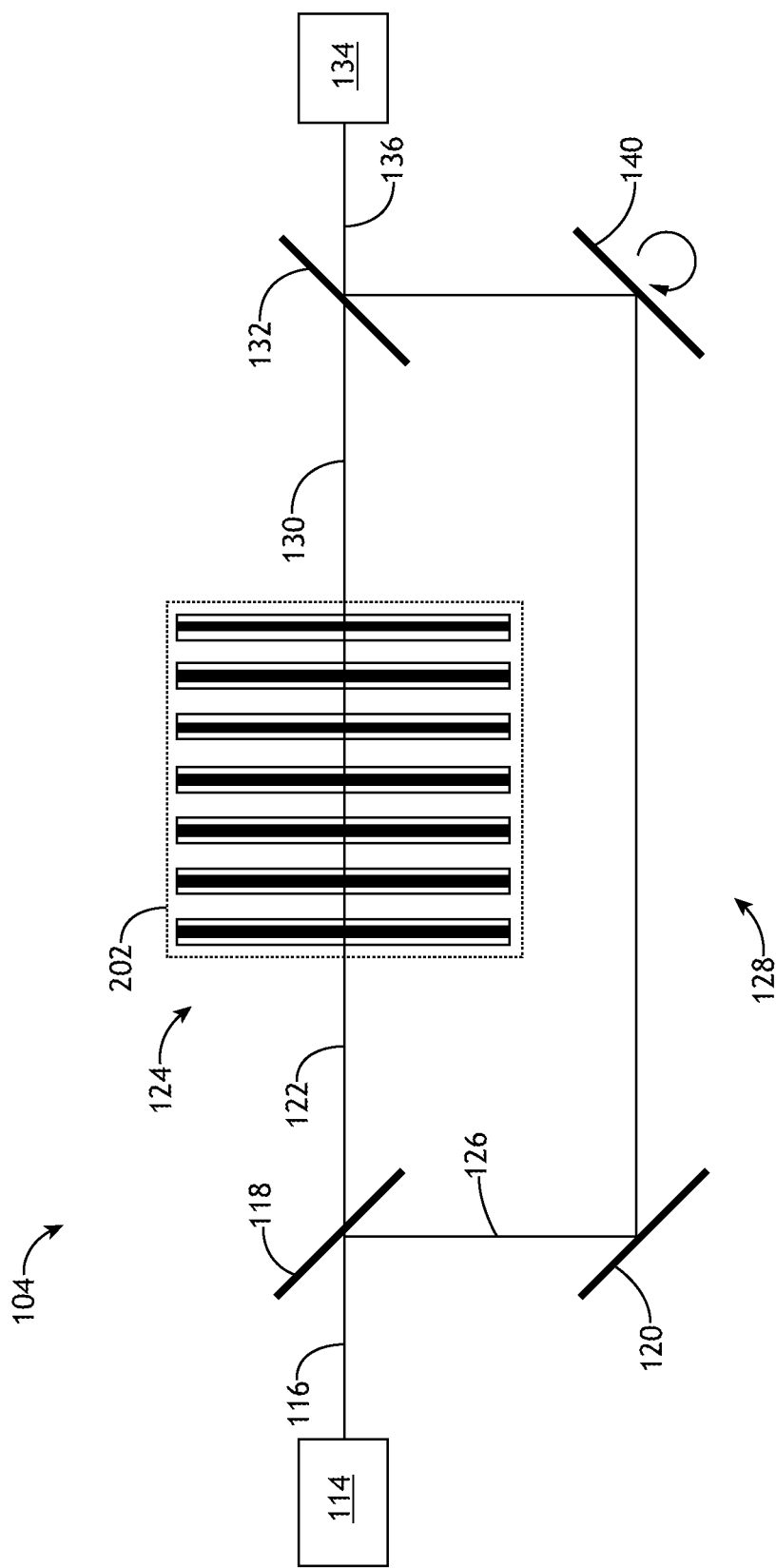
FIG. 1B is a conceptual top view of the interferometric overlay tool with an interferometer for measuring phase data from a grating-over-grating structure, in accordance with one or more embodiments of the present disclosure.

FIG. 1B is a conceptual top view of the interferometric overlay tool 102 with an interferometer 104 for measuring phase data from a grating-over-grating structure 202 in accordance with one or more embodiments of the present disclosure. In one embodiment, the interferometric overlay tool 102 includes an illumination source 114 to generate an illumination beam 116 and an interferometer 104 for generating interferometric phase data of a sample 106.

The illumination source 114 may include any type of light source suitable for providing coherent light for the measurement of phase data using the interferometer 104. Further, the illumination beam 116 may include one or more selected wavelengths of light including, but not limited to, ultraviolet (UV) radiation, visible radiation, or infrared (IR) radiation. In this way, the illumination source 114 may generate a broadband illumination beam 116, a narrow-band illumination beam 116, and/or a tunable illumination beam 116 with a tunable spectrum.

In one embodiment, the illumination source 114 includes a laser source. For example, the illumination source 114 may include, but is not limited to, one or more narrowband laser sources, one or more broadband laser sources, one or more supercontinuum laser sources, one or more white light laser sources, or the like. Further, the illumination source 114 may include any type of laser source known in the art including, but not limited to, a diode laser source or a diode-pumped laser source.

In another embodiment, the illumination source 114 includes a broadband plasma (BBP) illumination source. In this regard, the illumination beam 116 may include radiation emitted by a plasma. For example, a BBP illumination source 114 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination beam 116.

In another embodiment, the illumination source 114 provides a tunable illumination beam 116. For example, the illumination source 114 may include a tunable source of illumination (e.g., one or more tunable lasers, and the like). By way of another example, the illumination source 114 may include a broadband illumination source coupled to a tunable filter.

The illumination source 114 may further provide an illumination beam 116 having any temporal profile. For example, the illumination beam 116 may have a continuous temporal profile, a modulated temporal profile, a pulsed temporal profile, or the like.

In one embodiment, the interferometer 104 includes one or more beamsplitters 118 or other components (e.g., mirrors 120) to split the illumination beam 116 into a probe beam 122 directed along a probe path 124 and a reference beam 126 directed along a reference path 128. Further, the sample 106 (e.g., a grating-over-grating structure 202 on the sample 106) may be placed in the probe path 124. In this way, the probe beam 122 may be incident on the sample 106 and a measurement beam 130 associated with light reflected, diffracted and/or scattered from the sample 106 may also be directed along the probe path 124. The interferometer 104 may further include one or more beam combiners 132 to interfere the measurement beam 130 with the reference beam 126. The interferometer 104 may generally include any type of interferometric device known in the art and may interfere the measurement beam 130 with the reference beam 126 with any geometry. For example, the interferometer 104 may interfere the measurement beam 130 with the reference beam 126 directly on a detector 134. By way of another example, the interferometer 104 may combine the measurement beam 130 and the reference beam 126 along a common collection path 136, where the detector 134 is located on the common collection path 136. In any case, the intensity of light on the detector 134 may be associated with an interference between the measurement beam 130 and the reference beam 126 and may be generally dependent on the relative phase difference between the measurement beam 130 and the reference beam 126.

In another embodiment, the sample 106 is located on a sample stage 138. The sample stage 138 may include any type of translation stage known in the art suitable for aligning one or more features on the sample 106 (e.g., a target) within the interferometric overlay tool 102 for performing a scatterometry measurement. For example, the sample stage 138 may include any combination of a linear translation stage, a rotational stage, or a tip/tilt stage.

In another embodiment, the interferometer 104 includes a variable phase delay 140 to introduce a selected phase delay, or optical path difference (OPD), between the probe path 124 and the reference path 128 (e.g., between the probe beam 122/measurement beam 130 and the reference beam 126). In this way, interferometric phase data associated with a grating-over-grating structure 202 on the sample 106 may be captured. The variable phase delay 140 may include any number of optical components suitable for controlling or otherwise modifying the relative phase difference between the measurement beam 130 and the reference beam 126.

In one embodiment, the variable phase delay 140 includes one or more adjustable optical elements (e.g., mirrors) to provide an adjustable path length of the reference beam 126 along the reference path 128. In this way, the path length may be sequentially adjusted to provide different values of the OPD. For example, the variable phase delay 140 may include one or more mirrors on one or more linear translation stages arranged to provide an adjustable OPD (e.g., as an adjustable delay path). By way of another example, the variable phase delay 140 may include one or more mirrors or other optical elements on one or more rotation stages arranged to provide an adjustable OPD based on tilting the mirrors or other optical elements. By way of another example, the variable phase delay 140 may include a phase retarder (e.g., a phase modulator, or the like) such as, but not limited to, a spatial light modulator or a Pockels cell to provide adjustable phase control.

In another embodiment, the interferometric overlay tool 102 includes one or more beam expanders to expand the probe beam 122 and the reference beam 126 along an expansion direction or two-dimensional distribution. In this way, the variable phase delay 140 may simultaneously introduce a varying OPD along the expansion direction or two-dimensional distribution. In this way, interferometric phase data associated with multiple OPD values may be generated in a single measurement.

For example, the interferometric overlay tool 102 may include a beam expander to expand the illumination beam 116 prior to entering the interferometer 104. In this way, both the probe beam 122 and the reference beam 126 are similarly expanded. By way of another example, the variable phase delay 140 may include separate beam expanders in each of the probe path 124 and the reference path 128.

The variable phase delay 140 may then include any number or type of elements suitable for providing a variable phase delay between the probe beam 122 and the reference beam 126 along the expansion direction. For example, the variable phase delay 140 may include, but is not limited to, one or more tilted optical elements (e.g., tilted plates, tilted lenses, or the like) or one or more optical wedges (e.g., prisms). Such elements may further be located in the probe path 124 and/or the reference path 128 of the interferometer 104. By way of another example, the variable phase delay 140 may include a two-dimensional phase retarder (e.g., phase modulator) such as, but not limited to, a spatial light modulator providing variable control of the phase along the expansion direction.

The detector 134 may include any type of optical detector known in the art suitable for capturing the interference of the measurement beam 130 and the reference beam 126 along the collection path 136. In one embodiment, the detector 134 includes one or more single-pixel sensors such as, but not limited to, a photodiode, an avalanche photodiode (APD), a photomultiplier tube (PMT), or the like. In another embodiment, the detector 134 includes a multi-pixel sensor such as, but not limited to, a charge-coupled-device (CCD), a complementary metal-oxide-semiconductor (CMOS) detector, or the like. For example, a multi-pixel detector 134 may simultaneously capture the interference between the measurement beam 130 and the reference beam 126 for multiple phase offsets in a configuration where the variable phase delay 140 provides a reference beam 126 with a varying phase delay along an expansion direction.

By way of another example, the detector 134 may include one or more dispersive elements such as, but not limited to, one or more diffraction gratings or one or more prisms. In this way, the detector 134 may operate as a spectroscopic detector to provide phase data associated with multiple wavelengths. A spectroscopic detector 134 may further include a single-pixel sensor or a multi-pixel sensor as described above.

Figure 1C:
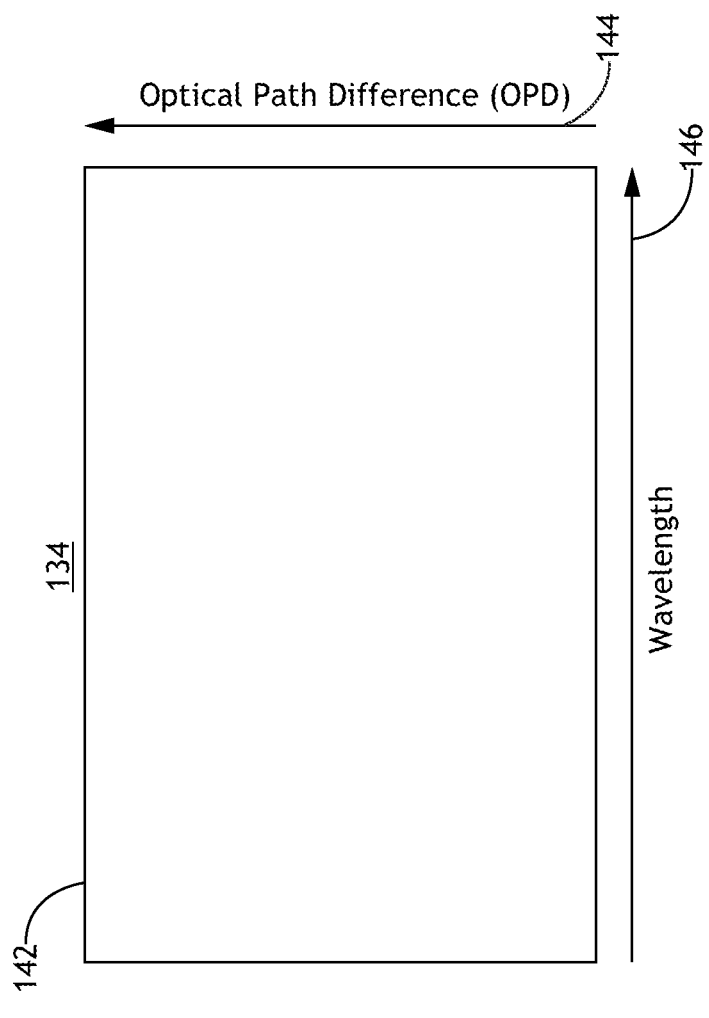
FIG. 1C is a conceptual top view of a spectroscopic detector illustrating simultaneous capture of interferometric phase data associated with multiple wavelengths and multiple OPD values, in accordance with one or more embodiments of the present disclosure.

FIG. 1C is a conceptual top view of a spectroscopic detector 134 illustrating simultaneous capture of interferometric phase data associated with multiple wavelengths and multiple OPD values, in accordance with one or more embodiments of the present disclosure. In one embodiment, the detector 134 includes a two-dimensional multi-pixel sensor 142 (e.g., a focal plane array (FPA), or the like), where OPD is distributed along a first direction 144 (here the Y direction) and wavelength is distributed along a second direction 146 (here the X direction). In this way, the detector 134 may simultaneously capture spectrally-resolved phase data at multiple values of the OPD. For instance, each row of pixels along the X direction in FIG. 1C may include phase data associated with multiple wavelengths for a particular OPD value. Similarly, each column of pixels along the Y direction in FIG. 1C may include phase data associated with multiple values of the OPD for a single wavelength.

It is contemplated herein that the distribution of the interference of the measurement beam 130 with the reference beam 126 illustrated in FIG. 1C may be obtained using a variety of configurations of the interferometric overlay tool 102. In one embodiment, the interferometric overlay tool 102 includes an illumination source 114 to generate a broadband (or multi-wavelength) illumination beam 116, a variable phase delay 140 arranged to expand the measurement beam 130 and the reference beam 126 along the Y direction, and one or more diffractive elements in the collection path 136 to diffract the combined measurement beam 130 and reference beam 126 along the X direction.

Referring now to FIGS. 1D-1H, various components of the interferometric overlay tool 102 are described in greater detail in accordance with one or more embodiments of the present disclosure.

It is contemplated herein that the interferometric overlay tool 102 may include or otherwise be incorporated into any type of scatterometry metrology system known in the art such as, but not limited to, a scatterometer, a reflectometer, a spectroscopic reflectometer, an ellipsometer, a spectroscopic ellipsometer with one or more angles of illumination, or a spectroscopic ellipsometer for measuring Mueller matrix elements (e.g., using rotating compensators). In this regard, various parameters of the illumination beam 116 and/or the measurement beam 130 such as, but not limited to, intensity, polarization, or angle of the illumination beam 116 and/or the measurement beam 130 may be controlled or otherwise adjusted for a measurement. For example, the probe path 124 of the interferometer 104 may correspond to a measurement path of a scatterometry metrology system. In this way, any type of scatterometry data may be obtained based on the probe path 124 alone when the reference path 128 is blocked or otherwise not utilized (e.g., the illumination beam 116 is directed completely into the probe path 124). Further, interferometric phase data may be obtained using both the probe path 124 and the reference path 128 as disclosed herein. Still further, it is contemplated herein that an interferometric overlay tool 102 as disclosed herein may provide hybrid measurements in the probe path 124 is configured for the capture of any type of scatterometry data known in the art and multiple measurements are generated with different OPD values induced by the variable phase delay 140 (e.g., located in the reference path 128). In a general sense, an interferometric overlay tool 102 as disclosed herein may thus be configured to provide interferometric phase data as well as any other scatterometry data known in the art.

A metrology tool including multiple hardware configurations is generally described in U.S. Pat. No. 7,933,026 issued on Apr. 26, 2011, which is incorporated herein by reference in its entirety. A metrology system incorporating multiple metrology tools is generally described in U.S. Pat. No. 7,478,019 issued on Jan. 13, 2009, which is incorporated herein by reference in its entirety. Focused beam ellipsometry based on primarily reflective optics is generally described in U.S. Pat. No. 5,608,526 issued on Mar. 4, 1997, which is incorporated herein by reference in its entirety. The use of apodizers to mitigate the effects of optical diffraction causing the spread of the illumination spot beyond the size defined by geometric optics is generally described in U.S. Pat. No. 5,859,424 issued on Jan. 12, 1999, which is incorporated herein by reference in its entirety.

Figure 1D:
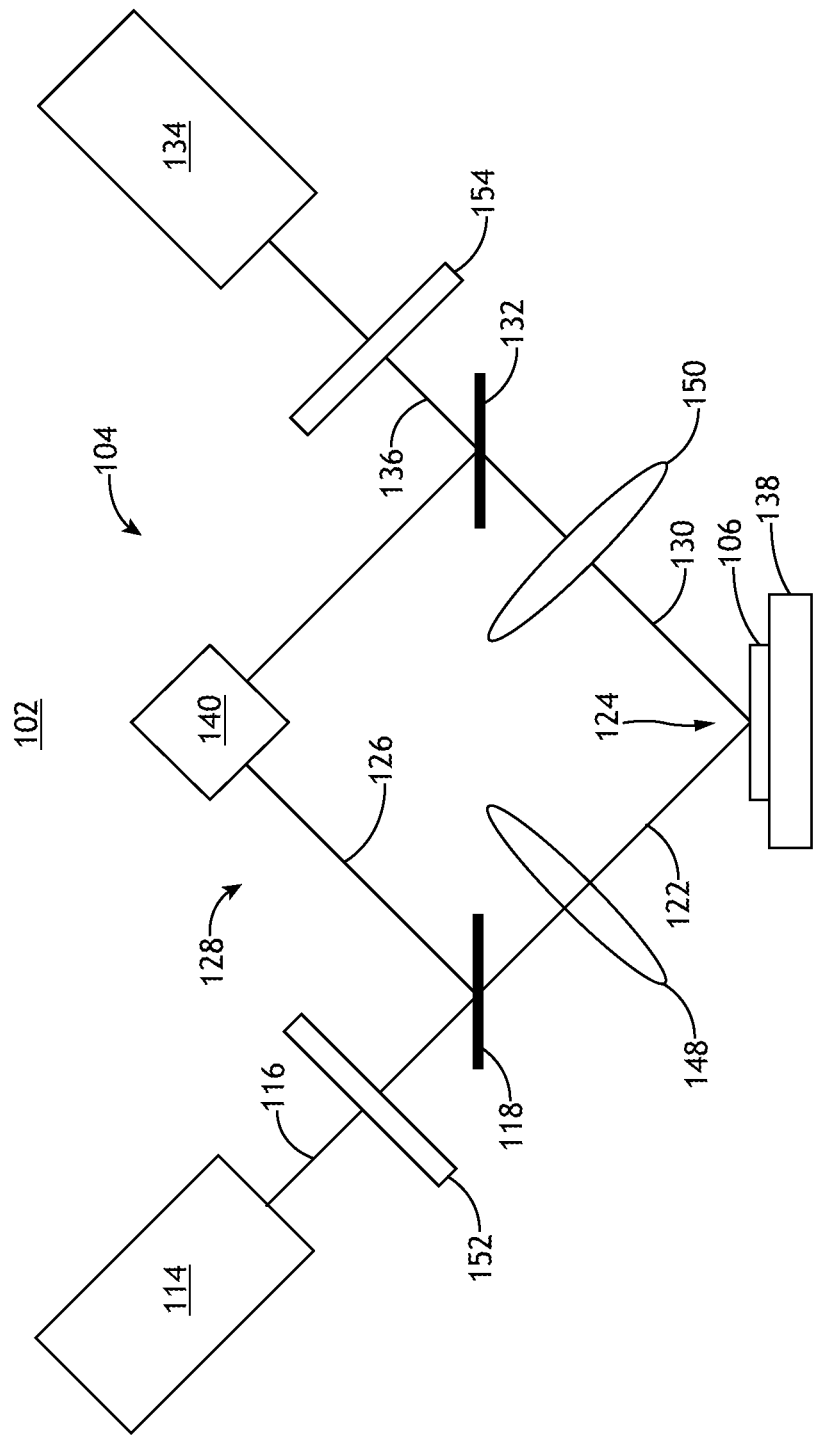
FIG. 1D is a conceptual view of an interferometric overlay tool providing separate illumination and collection pathways, in accordance with one or more embodiments of the present disclosure.

FIG. 1D is a conceptual view of an interferometric overlay tool 102 providing separate illumination and collection pathways, in accordance with one or more embodiments of the present disclosure.

In one embodiment, the interferometric overlay tool 102 includes an illumination focusing element 148 along the probe path 124 to focus the illumination beam 116 onto the sample 106 and a collection focusing element 150 to collect the measurement beam 130 from the sample 106 along the probe path 124 (e.g., reflected, diffracted, and/or scattered light).

The interferometric overlay tool 102 may also include illumination beam-conditioning elements 152 to control various characteristics of the probe beam 122 on the sample 106 and/or collection beam-conditioning elements 154 to control various characteristics of the measurement beam 130 from the sample 106. For example, the illumination beam-conditioning elements 152 and/or the collection beam-conditioning elements 154 may include, but are not limited to, one or more polarizers, one or more filters, one or more beam splitters, one or more apodizers, or one or more beam shapers, one or more diffusers, one or more homogenizers, or one or more lenses. In this way, the interferometric overlay tool 102 may operate as any type of reflectometer, scatterometer, or ellipsometer known in the art.

FIG. 1D also illustrates a variable phase delay 140 in the reference path 128 to introduce, control, or otherwise modify an optical phase of the reference beam 126 relative to the measurement beam 130. However, it is to be understood that the particular layout in FIG. 1D is provided solely for illustrative purposes and should not be interpreted as limiting. For example, the variable phase delay 140 may be placed in the probe path 124.

It is contemplated herein that the interferometric overlay tool 102 depicted in FIG. 1D may facilitate multi-angle illumination of the sample 106, and/or more than one illumination source 114 (e.g., coupled to one or more additional detectors 134). In this regard, the interferometric overlay tool 102 depicted in FIG. 1D may perform multiple metrology measurements. In one embodiment, the interferometric overlay tool 102 may include multiple detectors 134 to facilitate multiple metrology measurements (e.g., multiple metrology tools) by the interferometric overlay tool 102. In another embodiment, one or more optical components may be mounted to a rotatable arm (not shown) pivoting around the sample 106 such that the angle of incidence of the illumination beam 116 on the sample 106 may be controlled by the position of the rotatable arm.

Referring now to FIGS. 1E-1H, in some embodiments, a common focusing element (e.g., an objective lens 156) is used to simultaneously illuminate the sample 106 with the probe beam 122 and collect the measurement beam 130 from the sample 106.

Figure 1E:
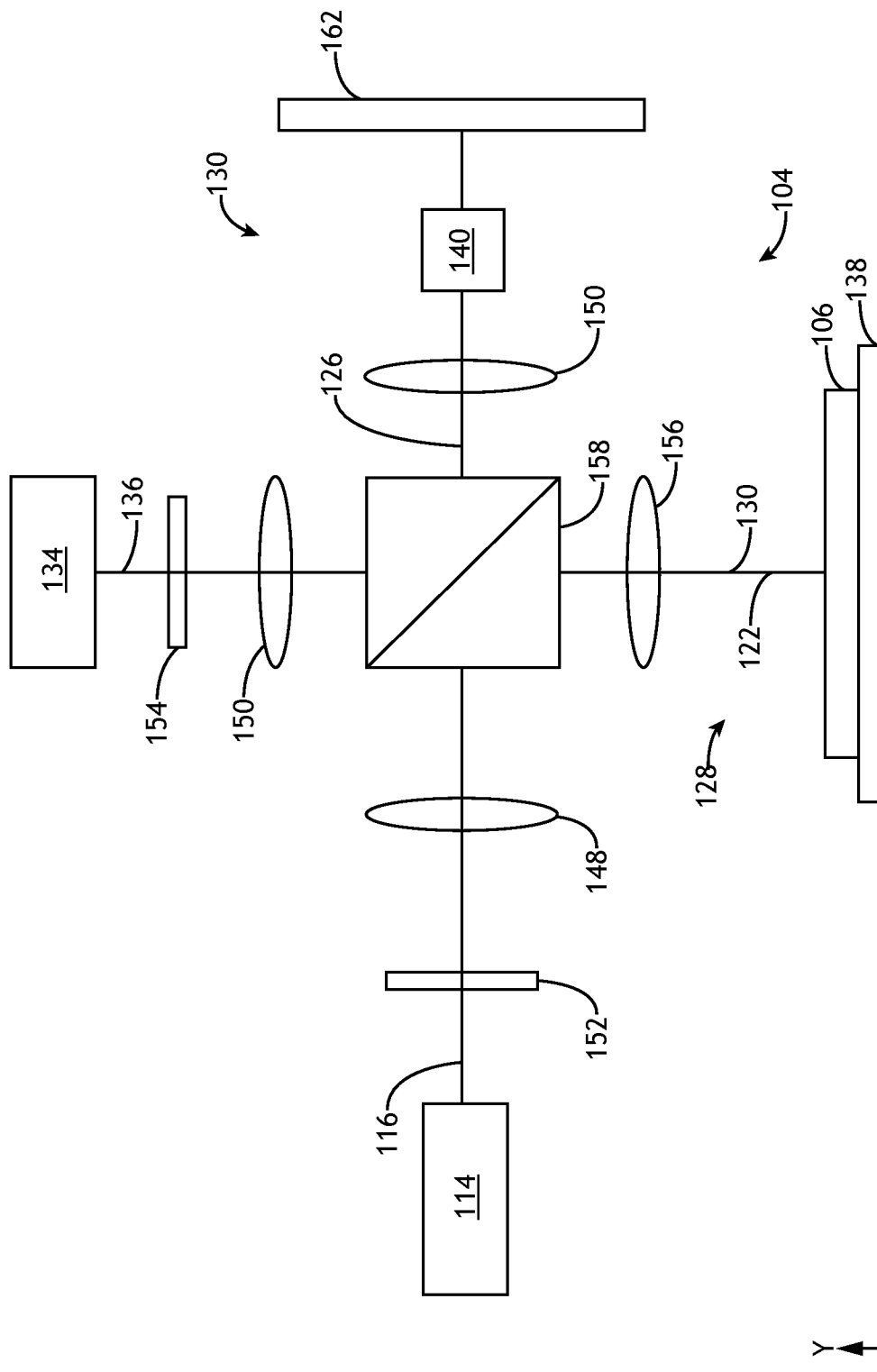
FIG. 1E is a conceptual view of an interferometric overlay tool configured with a common objective lens, in accordance with one or more embodiments of the present disclosure.

FIG. 1E is a conceptual view of an interferometric overlay tool 102 configured with a common objective lens 156, in accordance with one or more embodiments of the present disclosure. In one embodiment, the interferometric overlay tool 102 includes a common element (here illustrated as a cube beamsplitter 158) to operate both as a beamsplitter 118 and beam combiner 132 of the interferometer 104. In this regard, the objective lens 156 may replace the illumination focusing element 148 and the collection focusing element 150 of FIG. 1C. The interferometer 104 may further include a reference objective lens 160 in the reference path 128 to focus the reference beam 126 onto a reference mirror 162 and collect the reflected reference beam 126. In this way, the interferometer 104 may be configured as a Linnik or Michelson interferometer.

Figure 1F:
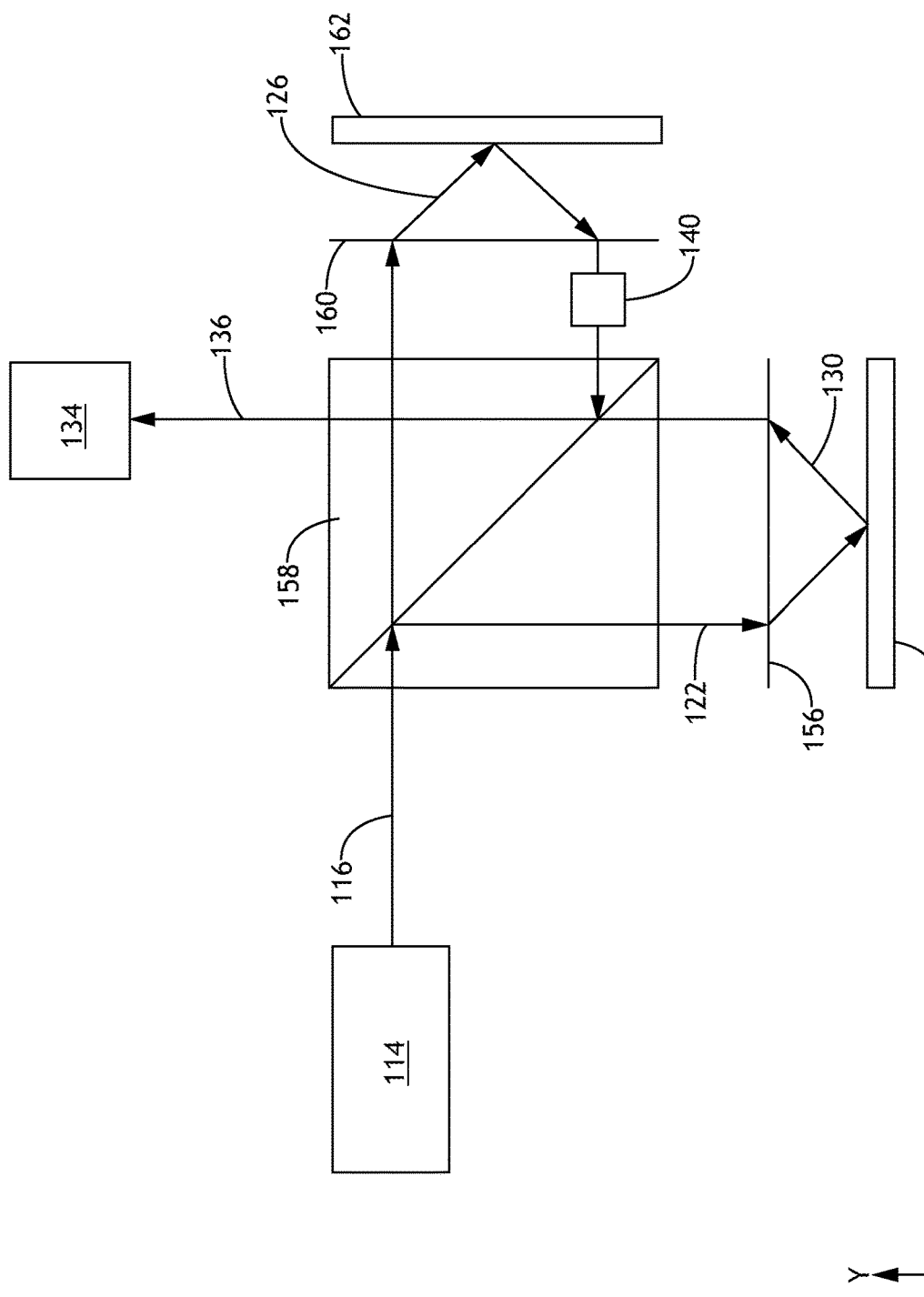
FIG. 1F is a conceptual side view of the interferometer of FIG. 1E illustrating beam paths of the probe beam and reference beam, in accordance with one or more embodiments of the present disclosure.

FIG. 1F is a conceptual side view of the interferometer 104 of FIG. 1E illustrating beam paths of the probe beam 122 and reference beam 126 in accordance with one or more embodiments of the present disclosure. In one embodiment, the illumination beam 116 is incident on the cube beamsplitter 158 at an off-center position such that the measurement beam 130 and the reference beam 126 are recombined at a different location of the cube beamsplitter 158 as illustrated in FIG. 1F. Further, the interferometer 104 may include the variable phase delay 140 in either the probe path 124 or the reference path 128 (e.g., as illustrated in FIG. 1F).

As described previously herein, the variable phase delay 140 may include one or more optical elements suitable for modifying or otherwise controlling the OPD between the probe path 124 and the reference path 128. Further, the variable phase delay 140 may adjust the OPD sequentially or simultaneously.

Figure 1G:
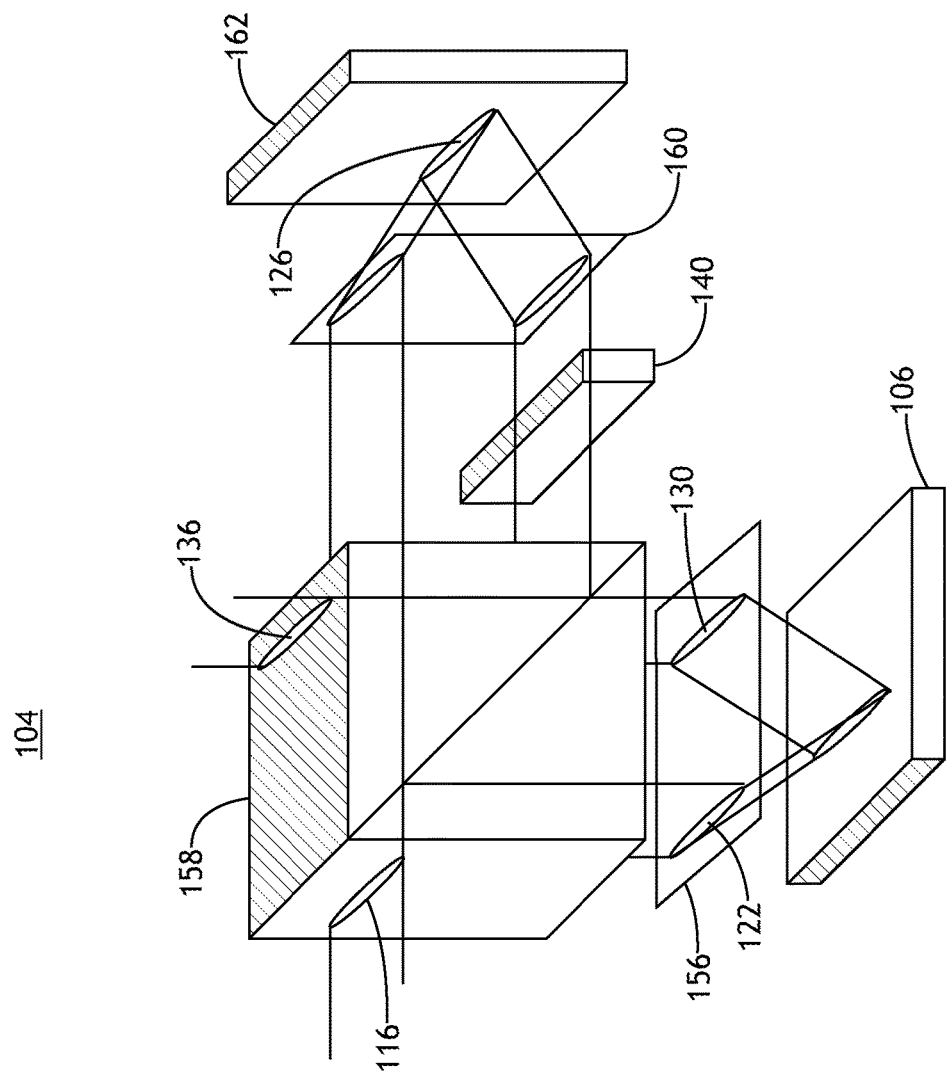
FIG. 1G is a conceptual perspective view of the interferometer of FIG. 1E illustrating a configuration in which the illumination beam, the probe beam, and the reference beam are expanded along an expansion direction for simultaneous measurement with multiple OPDs along the expansion direction, in accordance with one or more embodiments of the present disclosure.

FIG. 1G is a conceptual perspective view of the interferometer 104 of FIG. 1E illustrating a configuration in which the illumination beam 116, the probe beam 122, and the reference beam 126 are expanded along an expansion direction (here the Y direction) for simultaneous measurement with multiple OPDs along the expansion direction, in accordance with one or more embodiments of the present disclosure.

In one embodiment, as illustrated in FIG. 1G, the illumination beam 116 is expanded along the expansion direction (e.g., the Y direction here) prior to the cube beamsplitter 158 such that the probe beam 122 and the reference beam 126 may be similarly expanded. Although the illumination beam 116 is illustrated as extended in a linear pattern along the expansion direction, the illumination beam 116 (and thus the probe beam 122 and the reference beam 126) may generally have any two-dimensional profile or distribution. It is contemplated herein that the spatial profile of the probe beam 122 and reference beam 126 may manifest as a distribution of incidence angles on the sample 106 and the reference mirror 162. In this way, the spatial profile of the probe beam 122 and the reference beam 126 may be tailored to provide any selected distribution of incidence angles. For example, the probe beam 122 and the reference beam 126 may have, but are not required to have, curved distributions to provide varying azimuth incidence angles while maintaining constant altitude incidence angles.

As described previously herein, the variable phase delay 140 in this configuration may provide a varying OPD distribution along the expansion direction. For example, the variable phase delay 140 may include a spatial light modulator providing a varying OPD along the expansion direction. By way of another example, the variable phase delay 140 may include one or more prisms or optical wedges providing varying thickness along the expansion direction. By way of another example, the variable phase delay 140 may include one or more tilted optical elements (e.g., tilted plates, tilted prisms, tilted lenses, or the like).

FIG. 1H is a conceptual side view of the interferometer 104 of FIG. 1E illustrating a configuration in which the detector 134 includes a dispersive element 164 to generate spectroscopic phase data, in accordance with one or more embodiments of the present disclosure.

In one embodiment, the detector 134 is a spectroscopic detector including a dispersive element 164 to disperse light along the collection path 136 along a dispersion direction 166 (e.g., here the X direction). In this way, the interferometric overlay metrology system 100 may simultaneously capture spectral phase data associated with one or more OPD values. The illumination beam 116 in this configuration may include any selected spectrum of light suitable for overlay measurements. The dispersive element 164 may include any type of dispersive element known in the art such as, but not limited to, one or more diffraction gratings or one or more prisms.

Further, as described previously herein, the interferometric overlay metrology system 100 may capture the spectral phase data associated with a particular OPD value simultaneously or sequentially. In one embodiment, the variable phase delay 140 sequentially introduces different OPD values between the probe path 124 and the reference path 128 and the detector 134 sequentially generates spectral phase data for each value of the OPD. In another embodiment, as illustrated in FIG. 1F, the probe beam 122 and the reference beam 126 are expanded along the expansion direction (or any selected two-dimensional distribution) such that the variable phase delay 140 may simultaneously introduce different OPD values along the expansion direction. In this configuration, the detector 134 may include a two-dimensional sensor configured as illustrated in FIG. 1C (or a similar configuration) to simultaneously capture spectral phase data for multiple OPD values.

Referring again to FIG. 1A, various aspects of the controller 108 are described in greater detail in accordance with one or more embodiments of the present disclosure.

The one or more processors 110 of a controller 108 may include any processing element known in the art. In this sense, the one or more processors 110 may include any microprocessor-type device configured to execute algorithms and/or instructions. In one embodiment, the one or more processors 110 may consist of a desktop computer, mainframe computer system, workstation, image computer, parallel processor, or any other computer system (e.g., networked computer) configured to execute a program configured to operate the interferometric overlay metrology system 100, as described throughout the present disclosure. It is further recognized that the term "processor" may be broadly defined to encompass any device having one or more processing elements, which execute program instructions from a non-transitory memory medium 112.

The memory medium 112 may include any storage medium known in the art suitable for storing program instructions executable by the associated one or more processors 110. For example, the memory medium 112 may include a non-transitory memory medium. By way of another example, the memory medium 112 may include, but is not limited to, a read-only memory, a random-access memory, a magnetic or optical memory device (e.g., disk), a magnetic tape, a solid-state drive and the like. It is further noted that memory medium 112 may be housed in a common controller housing with the one or more processors 110. In one embodiment, the memory medium 112 may be located remotely with respect to the physical location of the one or more processors 110 and controller 108. For instance, the one or more processors 110 of controller 108 may access a remote memory (e.g., server), accessible through a network (e.g., internet, intranet and the like). Therefore, the above description should not be interpreted as a limitation on the present invention but merely an illustration.

Additionally, the controller 108 and any associated components (e.g., the processors 110, the memory medium 112, or the like) may be housed in a common housing or within multiple housings. Further, the controller 108 may be communicatively coupled with any component of the interferometric overlay metrology system 100 including the interferometric overlay tool 102 or any component therein. In this way, the controller 108 may direct or otherwise control (e.g., via control signals) or receive data from any of the components in the interferometric overlay metrology system 100. For example, the controller 108 may direct the variable phase delay 140 of the interferometer 104 to provide a selected phase delay between the measurement beam 130 and the reference beam 126 for a particular measurement.

For example, the controller 108 may control various components of the interferometric overlay tool 102 to provide selected illumination and/or collection conditions for a measurement. By way of another example, the controller 108 may control the variable phase delay 140 of the interferometer 104 to provide a selected phase delay between the measurement beam 130 and the reference beam 126 for a particular measurement. By way of another example, the controller 108 may receive metrology data from the detector 134 (e.g., associated with interference of the measurement beam 130 and the reference beam 126). By way of a further example, the controller 108 may generate an overlay measurement of the sample 106 based on the data received by the detector 134.

The controller 108 may additionally perform any number of processing or analysis steps disclosed herein including, but not limited to, receiving, generating, or applying a model to relate interferometric phase data to overlay error on a grating-over-grating structure 202, which may involve a number of algorithms. For example, an overlay target or other portion of the sample 106 including grating-over-grating features may be modeled (parameterized) using any technique known in the art including, but not limited to, a geometric engine, a process modeling engine, or a combination thereof. The use of process modeling is generally described in U.S. Pat. No. 10,769,320 issued on Sep. 8, 2020, which is incorporated herein by reference in its entirety. A geometric engine may be implemented, but is not required to be implemented, by AcuShape software, a product provided by KLA Corp. By way of another example, optical interaction of an illumination beam with a metrology target on a sample may, but is not limited to, be modeled using an electro-magnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis.

The controller 108 may further analyze collected data from the interferometric overlay tool 102 using any data fitting and optimization technique known in the art to apply the collected data to the model including, but not limited to libraries, fast-reduced-order models, regression, machine-learning algorithms such as neural networks, support-vector machines (SVM), dimensionality-reduction algorithms (e.g. principal component analysis (PCA), independent component analysis (ICA), local-linear embedding (LLE), and the like), and/or sparse representation of data (e.g., Fourier or wavelet transforms, Kalman filters, algorithms to promote matching from same or different tool types, and the like). For example, data collection and/or fitting may be, but is not required to be, performed by Signal Response Metrology (SRM), a product provided by KLA Corp.

Further, the various implementations of algorithms may be, but are not required to be, performed by the controller 108 (e.g., though firmware, software, or field-programmable gate arrays (FPGAs), and the like), or one or more programmable optical elements associated with the interferometric overlay tool 102.

Figure 3A:
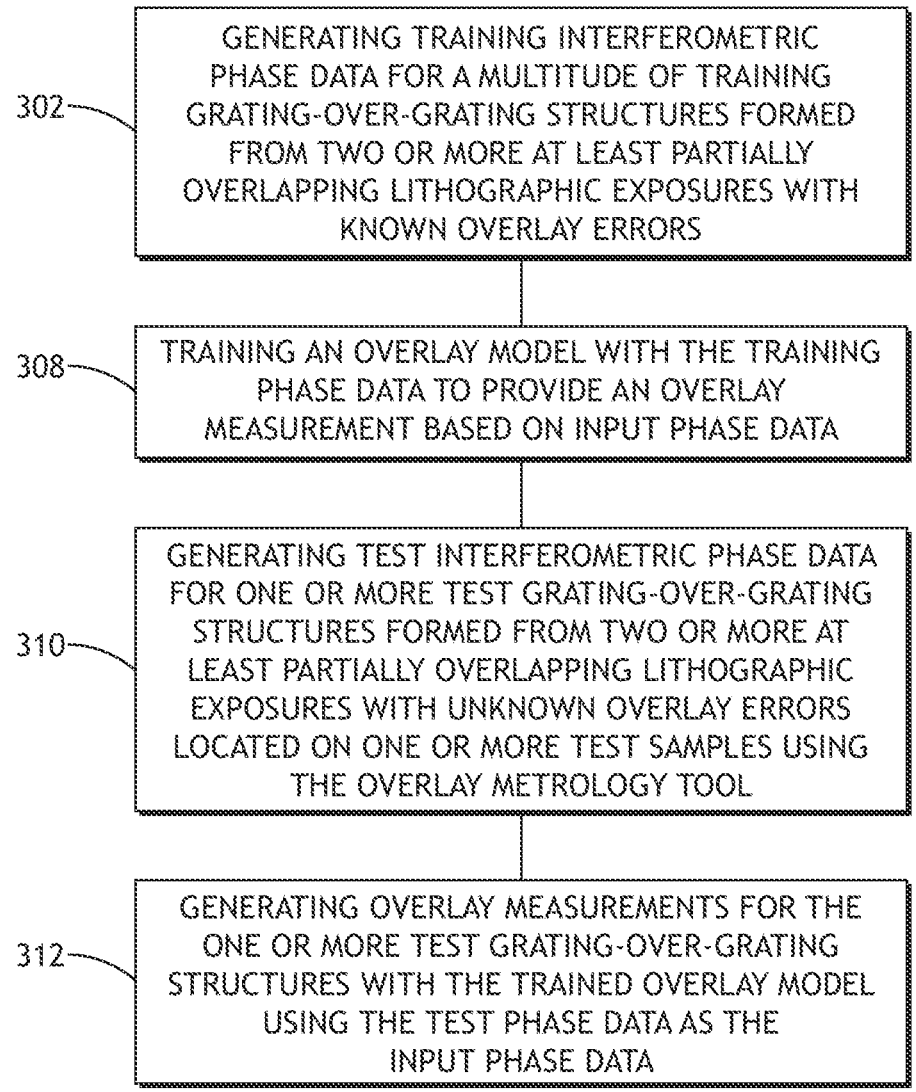
FIG. 3A is a flow diagram illustrating steps performed in a method for overlay metrology using an overlay model trained using interferometric phase data associated with one or more wavelengths of illumination, in accordance with one or more embodiments of the present disclosure.
Figure 3B:
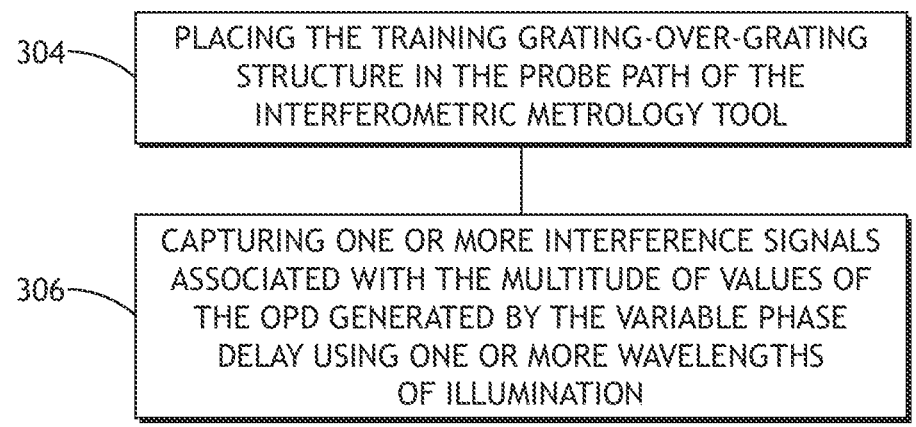
FIG. 3B is a flow diagram illustrating steps associated with implementing the step of generating training phase data for a particular training grating-over-grating structure using a physical interferometric metrology tool, in accordance with one or more embodiments of the present disclosure.

Referring now generally to FIGS. 3A and 3B, scatterometry overlay methods using spectral phase data are described in greater detail in accordance with one or more embodiments of the present disclosure.

It is contemplated herein that the relative positions of the first and second gratings in a grating-over-grating structure 202 (e.g., overlay information) is embedded in light that is reflected, diffracted, and/or scattered from the grating-over-grating structure 202. In particular, each grating in a grating-over-grating structure 202 may separately reflect, diffract, and/or scatter an incident illumination beam. Further, differences in the physical positions of the constituent gratings may result in differences in phase between the light from the constituent gratings. As a result, overlay may be determined based at least in part on interferometric measurement of phase data associated with a grating-over-grating structure 202 measured at one or more illumination wavelengths. For instance, an overlay model may be trained or otherwise generated that relates physical overlay to interferometric phase data. As a result, the overlay model may be suitable for providing overlay measurements during runtime on grating-over-grating structures 202 with unknown overlay values. As an example, model-based scatterometry overlay using signal response metrology is generally described in U.S. Pat. No. 10,352,876 issued on Jul. 16, 2019, which is referenced above and incorporated herein by reference in its entirety. It is contemplated herein that similar model-based techniques may be applied to relate overlay to interferometric phase data as disclosed herein. Further, a model-based technique may be implemented using interferometric phase data alone or using interferometric phase data as one of multiple inputs. In this way, overlay may be related to multiple measurable signals to provide sensitive and accurate metrology.

In one embodiment, an overlay model may directly relate interferometric phase data associated with one or more wavelength of illumination to physical overlay. In this way, measured interferometric phase data associated with a test grating-over-grating structure may be directly related to a measurement of the physical overlay.

For example, an overlay model may be based on a geometric engine, a process modeling engine, an electro-magnetic (EM) solver, or a combination thereof. In this way, physical overlay, whether associated with an induced offset or an offset error, may be directly attributed to particular measurable characteristics of interferometric phase data that may be captured using an interferometric metrology tool. The use of process modeling is generally described in U.S. Pat. No. 10,769,320 issued on Sep. 8, 2020, which is referenced above and incorporated herein by reference in its entirety. A geometric engine may be, but is not required to be, implemented, using AcuShape software, a product provided by KLA Corp. An EM solver may model or simulate the optical interaction of an illumination beam (e.g., at one or more wavelengths) with a grating-over-grating structure as well as the resulting interference phase data measurable with an interferometric metrology tool. Such an EM solver may generally utilize any method known in the art including, but not limited to, rigorous coupled-wave analysis (RCWA), finite element method analysis, method of moments analysis, a surface integral technique, a volume integral technique, or a finite-difference time-domain analysis.

In another embodiment, an overlay model may be trained with measured and/or simulated interferometric phase data associated with training grating-over-grating structures having known physical overlays. For example, a design of experiments (DOE) may be generated in which a multitude of training grating-over-grating structures are created that have a spread of known overlay values. For instance, the spread of known overlay values may be associated with an expected range of overlay values that may be observed during runtime. In this way, the overlay model may be trained to identify patterns or correlations between the known physical overlays and the resulting interferometric phase data. After training, the overlay model may be used to estimate or predict the overlay of a test grating-over-grating structure having an unknown overlay using interferometric phase data as an input.

FIG. 3A is a flow diagram illustrating steps performed in a method 300 for overlay metrology using an overlay model trained using interferometric phase data associated with one or more wavelengths of illumination, in accordance with one or more embodiments of the present disclosure. Applicant notes that the embodiments and enabling technologies described previously herein in the context of the interferometric overlay metrology system 100 should be interpreted to extend to method 300. It is further noted, however, that the method 300 is not limited to the architecture of the interferometric overlay metrology system 100.

In one embodiment, the method 300 includes a step 302 of generating training interferometric phase data for a multitude of training grating-over-grating structures formed from two or more at least partially overlapping lithographic exposures with known overlay errors. For example, as illustrated in FIGS. 2A-2C, a grating-over-grating structure may be formed from two or more at least partially overlapping lithographic exposures on the training samples.

The training interferometric phase data may be associated with interferometric measurements of the training grating-over-grating structures with an interferometric metrology tool providing one or more wavelengths of illumination and including a variable phase delay configured to vary an optical path difference (OPD) between a probe path and a reference path of the interferometric metrology tool. As described previously in the context of the interferometric overlay metrology system 100, a variable phase delay may generally include any number or type of optical components suitable for providing a multitude of OPD values such as, but not limited to, a variable delay line, one or more translatable or rotatable mirrors, one or more tilted elements (e.g., lenses, plates, wedges, prisms, or the like), or variable phase retarders (e.g., spatial light modulators, or the like). Further, a multitude of OPD values may be introduced simultaneously between different portions of probe and reference beams or sequentially across the entire probe or reference beams. However, it is to be understood that the step 302 is not limited to the architecture of the interferometric overlay metrology system 100 or the descriptions thereof.

It is further contemplated herein that the training interferometric phase data may be generated based on measurements of training grating-over-grating structures fabricated on one or more training samples using an interferometric metrology tool, simulated measurements of modeled training grating-over-grating structures using a modeled interferometric metrology tool (e.g., corresponding to a physical interferometric metrology tool be used for runtime measurements), or a combination thereof.

FIG. 3B is a flow diagram illustrating steps (e.g., sub-steps) associated with implementing the step 302 of generating training phase data for a particular training grating-over-grating structure using a physical interferometric metrology tool, in accordance with one or more embodiments of the present disclosure. These steps may then be repeated for many training grating-over-grating structures. In one embodiment, the step 302 includes a step 304 of placing the training grating-over-grating structure in the probe path of the interferometric metrology tool. In another embodiment, the step 302 includes a step 306 of capturing one or more interference signals associated with the multitude of values of the OPD generated by the variable phase delay using one or more wavelengths of illumination. For example, the interference signals associated with the multitude of OPD values may be associated with narrow-band illumination to provide interferometric phase data associated with the training grating-over-grating structure associated with the spectrum of the narrowband illumination. By way of another example, spectral interferometric phase data may be generated by generating interferometric phase data using multiple wavelengths or wavelength ranges. This spectral interferometric data may be generated sequentially by sequentially capturing interferometric phase data associated with the multitude of OPD values with different wavelengths or sequentially using broadband illumination and a spectroscopic detector.

In some embodiments, spectral interferometric phase data for a grating-over-grating structure associated with the multitude of OPD values is generated simultaneously. For example, broadband probe light and reference light in the interferometric metrology tool may be spatially extended along an expansion direction such that the variable phase delay may simultaneously induce a varying OPD along the extended light. Further, the interference signals may be captured using a spectroscopic detector with one or more dispersive elements to disperse a spectrum of interfered probe and reference light along a direction orthogonal to the expansion direction. In this way, the captured interference signals may be distributed along two dimensions, with the OPD extended along one dimension and the spectrum along the other (e.g., as illustrated in FIG. 1C).

Referring again generally to FIG. 3A, training data may be generated using simulations of the generation of interferometric phase data of modeled training grating-over-grating structures in a modeled interferometric metrology tool. As in the case of measurements of physical samples, the modeled interferometric metrology tool may provide the interferometric phase measurements using various OPD values and/or illumination wavelengths simultaneously or sequentially.

In one embodiment, the method 300 includes a step 308 of training an overlay model with the training phase data to provide an overlay measurement based on input phase data. For example, the step 308 of training the overlay model may include receiving, generating, or applying a model to relate interferometric phase data to physical overlay on a grating-over-grating structure. In this way, patterns or correlations between overlay in a grating-over-grating structure and the resulting interferometric phase data at one or more wavelengths may be generated. Further, in the case that the overlay model considers additional spectroscopic data in addition to the interferometric phase data disclosed herein, multi-parameter or multi-dimensional patterns or correlations between physical overlay and any number of measurable data sets may be generated.

It is contemplated herein that the overlay model trained in this step 308 may have any of a variety of structures. For example, the overlay model may incorporate libraries in which various characteristics of the interferometric phase data are linked or indexed to particular overlay values (or vice versa). By way of another example, the overlay model may implement, but is not required to implement, machine-learning algorithms such as neural networks, support-vector machines (SVM), or dimensionality-reduction algorithms (e.g. principal component analysis (PCA), independent component analysis (ICA), or local-linear embedding (LLE), or the like). Further, the overlay model may implement, but is not required to implement, sparse representation of data (e.g., Fourier or wavelet transforms, Kalman filters, or the like) to promote matching from various configurations of an interferometric metrology tool.

In one embodiment, the method 300 includes a step 310 of generating test interferometric phase data for one or more test grating-over-grating structures formed from two or more at least partially overlapping lithographic exposures with unknown overlay errors located on one or more test samples using the overlay metrology tool. For example, the test interferometric phase data may include interferometric measurements of the test grating-over-grating structures using the interferometric metrology tool. Further, the range of parameters associated with the test interferometric phase data may be the same as, or a subset of, the range of parameters used to develop the model. For instance, it may be the case that the process of training the overlay model identifies a subset of OPD values and/or illumination wavelengths that are most sensitive to physical overlay on the sample or are otherwise highly predictive of the physical overlay on the sample. Accordingly, interferometric phase data over this subset of parameters may provide efficient measurements without sacrificing accuracy or sensitivity of the overlay measurement.

In another embodiment, the method 300 includes a step 312 of generating overlay measurements for the one or more test grating-over-grating structures with the trained overlay model using the test phase data as the input phase data.

Once the overlay model is trained, the overlay model may provide an overlay measurement of test grating-over-grating structures having unknown overlays based on interferometric phase data. Accordingly, this step 312 may include providing the test interferometric data from step 310 to the overlay model trained in step 308. The step 312 may incorporate any data fitting or optimization technique known in the art to apply the collected interference signals to the model. Continuing the examples provided for step 302, this may include, but is not limited to, library searches, regression analyses, implementation of machine-learning algorithms, support-vector machines (SVM), dimensionality-reduction algorithms, or the like. For example, data collection and/or fitting may be, but is not required to be, performed by Signal Response Metrology (SRM) by KLA Corp.

Additionally, though not shown, the overlay measurements of the test grating-over-grating structures (e.g., generated during runtime) may be provided as or otherwise serve the basis of correctables for the control of one or more additional process tools (e.g., lithography tools or the like associated with one or more process steps associated with the layers of the sample on which the grating-over-grating structures are fabricated. For example, feedback correctables from one or more test samples may be generated to control a process tool during the fabrication of additional samples in the same or similar lots. By way of another example, feed-forward correctables from one or more test samples may be generated to control a process tool during the fabrication of additional samples layers on the same one or more test samples to compensate for observed overlay.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An interferometric overlay tool comprising:
    an interferometer comprising:
        one or more beamsplitters to split illumination from an illumination source into a probe beam along a probe path and a reference beam along a reference path, the illumination including one or more selected wavelengths;
        one or more illumination optics to illuminate a grating-over-grating structure with the probe beam, wherein the grating-over-grating structure is associated with two or more at least partially overlapping lithographic exposure fields;
        one or more collection optics to collect a measurement beam from the grating-over-grating structure;
        one or more beam combiners to combine the measurement beam and the reference beam as an interference beam; and
        a variable phase delay configured to vary an optical path difference (OPD) between the probe path and the reference path, wherein the measurement beam and the reference beam are extended in a two-dimensional distribution at least in part along an expansion direction, wherein the variable phase delay simultaneously induces varying OPD values along the two-dimensional distribution; and
    a controller communicatively coupled to the interferometer, the controller including one or more processors configured to execute program instructions causing the one or more processors to:
        receive one or more interference signals from a detector, wherein the detector simultaneously generates the interference signals associated with the varying OPD values, wherein the detector is positioned to capture the interference beam, wherein the one or more interference signals are representative of interferometric phase data associated with a plurality of OPD values and the one or more wavelengths of illumination; and
        determine an overlay error of the grating-over-grating structure based on the interferometric phase data.

2. The interferometric overlay tool of claim 1, wherein the illumination is a broadband illumination beam, wherein the detector includes a spectroscopic detector, wherein the one or more interference signals include spectral data for the plurality of OPD values.

3. The interferometric overlay tool of claim 2, wherein the spectroscopic detector includes one or more dispersive elements configured to disperse the interference beam along a dispersion direction orthogonal to the expansion direction, wherein the one or more interference signals include spectral data for the plurality of OPD values in a single measurement acquisition.

4. The interferometric overlay tool of claim 2, wherein the measurement beam and the reference beam are extended linearly along the expansion direction, wherein the variable phase delay induces varying OPD values along the expansion direction.

5. The interferometric overlay tool of claim 2, wherein the variable phase delay comprises:
    at least one of one or more prisms or one or more tilted optical elements.

6. The interferometric overlay tool of claim 2, wherein the variable phase delay comprises:
    a spatial light modulator.

7. The interferometric overlay tool of claim 1, wherein the variable phase delay sequentially induces the plurality of OPD values between the probe path and the reference path, wherein the one or more interference signals associated with the plurality of OPD values are captured sequentially by the detector.

8. The interferometric overlay tool of claim 1, wherein the interferometer comprises:
a Linnik interferometer.

9. The interferometric overlay tool of claim 8, wherein the Linnik interferometer comprises:
a single beamsplitter operating as the one or more beamsplitters and the one or more beam combiners, wherein the one or more illumination optics include a first objective lens in the probe path configured to direct the probe beam to the grating-over-grating structure at an oblique incidence angle, wherein the first objective lens further collects the measurement beam from the grating-over-grating structure; and
a second objective lens in the reference path configured to direct the reference beam to a reference sample at the oblique incidence angle, wherein the second objective lens further collects the reference beam upon reflection from the reference sample.

10. The interferometric overlay tool of claim 1, wherein the illumination source comprises:
one or more laser sources.

11. The interferometric overlay tool of claim 1, wherein the illumination source comprises:
a supercontinuum laser source.

12. The interferometric overlay tool of claim 1, wherein the illumination source comprises:
a laser-sustained plasma source.

13. The interferometric overlay tool of claim 1, wherein the determine the overlay error of the grating-over-grating structure based on the interferometric phase data comprises:
determine the overlay error of the grating-over-grating structure by providing the interferometric phase data as an input to an overlay model.

14. The interferometric overlay tool of claim 13, wherein the overlay model is trained using training interferometric phase data for a plurality of training grating-over-grating structures associated with the plurality of OPD values and the one or more wavelengths of illumination.

15. The interferometric overlay tool of claim 14, wherein the training interferometric phase data is generated by placing a particular one of the plurality of training grating-over-grating structures in the probe path and capturing one or more interference signals associated with the plurality of values of the OPD generated using the one or more wavelengths of illumination.

16. The interferometric overlay tool of claim 14, wherein the training interferometric phase data is generated by simulating a placement of the plurality of training grating-over-grating structures in the probe path of the interferometer and simulating one or more interference signals associated with the plurality of values of the OPD generated using the one or more wavelengths of illumination.

17. The interferometric overlay tool of claim 1, wherein the grating-over-grating structure is associated with two or more at least partially overlapping lithographic exposure fields on different layers.

18. The interferometric overlay tool of claim 17, wherein the grating-over-grating structure comprises:
one or more patterned elements on a first layer formed from a first lithographic exposure field and one or more additional processing steps; and
one or more lithographically-exposed features in a second layer formed from a second lithographic exposure, wherein the second layer is a resist layer.

19. The interferometric overlay tool of claim 17, wherein the grating-over-grating structure comprises:
one or more patterned elements on a first layer formed from a first lithographic exposure field; and
one or more patterned elements in a second layer formed from a second lithographic exposure.

20. The interferometric overlay tool of claim 1, wherein the grating-over-grating structure is associated with two or more at least partially overlapping lithographic exposure fields on a common layer.

21. An interferometric overlay metrology tool comprising:
an illumination source to generate broadband illumination;
an interferometer comprising:
one or more beamsplitters to split the broadband illumination into a probe beam along a probe path and a reference beam along a reference path, the broadband illumination including one or more selected wavelengths, wherein the probe beam and the reference beam are extended along an expansion direction;
one or more illumination optics to illuminate a grating-over-grating structure with the probe beam, wherein the grating-over-grating structure is associated with two or more at least partially overlapping lithographic exposure fields;
one or more collection optics to collect a measurement beam from the grating-over-grating structure;
one or more beam combiners to combine the measurement beam and the reference beam as an interference beam; and
a variable phase delay configured to vary an optical path difference (OPD) between the probe path and the reference path, wherein the variable phase delay induces a plurality of values of the OPD along the expansion direction;
a spectroscopic detector including one or more dispersive elements to spectrally disperse the interference beam along a dispersion direction orthogonal to the expansion direction, wherein the spectroscopic detector includes a two-dimensional sensor to generate an interference signal representative of interferometric phase data associated with the plurality of OPD values and the one or more wavelengths of illumination, wherein the plurality of OPD values are distributed along the expansion direction of the two-dimensional sensor and the one or more wavelengths of illumination are distributed along the dispersion direction; and
a controller communicatively coupled to the spectroscopic detector, the controller including one or more processors configured to execute program instructions causing the one or more processors to:
receive the interference signal from the spectroscopic detector, wherein the interference signal is representative of interferometric phase data associated with the plurality of OPD values and the one or more wavelengths of illumination; and
determine an overlay error of the grating-over-grating structure based on the interferometric phase data.

22. The interferometric overlay metrology tool of claim 21, wherein the interferometer comprises:
a Linnik interferometer.

23. An overlay metrology method comprising:
generating training interferometric phase data for a plurality of training grating-over-grating structures associated with two or more at least partially overlapping lithographic exposure fields with known overlay errors, wherein the training interferometric phase data is associated with interferometric measurements of the plurality of training grating-over-grating structures using an interferometric metrology tool providing one or more wavelengths of illumination and including a variable phase delay configured to vary an optical path difference (OPD) between a probe beam in a probe path and a reference beam in a reference path of the interferometric metrology tool, wherein the measurement beam and the reference beam are extended in a two-dimensional distribution at least in part along an expansion direction, wherein the variable phase delay simultaneously induces varying OPD values along the two-dimensional distribution;
training an overlay model with the training phase data to provide an overlay measurement based on input phase data;
generating test phase data for one or more test grating-over-grating structures formed from two or more at least partially overlapping lithographic exposures with unknown overlay errors located on one or more test samples using the interferometric metrology tool; and
generating overlay measurements for the one or more test grating-over-grating structures with the trained overlay model using the test phase data as the input phase data.

24. The overlay metrology method of claim 23, wherein generating the training phase data for a particular one of the plurality of training grating-over-grating structures includes placing the particular one of the plurality of training grating-over-grating structures in the probe path and capturing one or more interference signals associated with a plurality of values of the OPD generated using the one or more wavelengths of illumination.

25. The overlay metrology method of claim 23, wherein generating the training interferometric phase data includes simulating a placement of the plurality of training grating-over-grating structures in the probe path of the interferometric metrology tool and simulating one or more interference signals associated with the plurality of values of the OPD generated using the one or more wavelengths of illumination.

26. The overlay metrology method of claim 23, wherein varying the OPD between the probe path and the reference path comprises:
sequentially varying the OPD between the probe path and the reference path, wherein the one or more interference signals from the spectroscopic detector include a plurality of interference signals associated with the varying OPD.

27. The overlay metrology method of claim 26, wherein the interferometric metrology tool comprises:
a Linnik interferometer.

28. The overlay metrology method of claim 23, wherein varying the OPD between the probe path and the reference path comprises:
spreading the probe beam and the reference beam along an expansion direction; and
simultaneously varying the OPD between the probe path and the reference path, wherein the one or more interference signals from the spectroscopic detector includes a single measurement signal.

29. The overlay metrology method of claim 28, further comprising:
dispersing an interference beam along a dispersion direction orthogonal to the expansion direction, the interference beam associated with interference of the probe path and the reference path, wherein the single measurement signal includes a two-dimensional image in which the phase difference between the sample beam and the reference beam varies along the expansion direction and a spectrum varies along the dispersion direction.

30. The overlay metrology method of claim 28, wherein the interferometric metrology tool comprises:
a Linnik interferometer.

31. The overlay metrology method of claim 3, wherein the interferometric metrology tool comprises one or more laser sources.

32. The overlay metrology method of claim 23, wherein the interferometric metrology tool comprises a supercontinuum laser source.

33. The overlay metrology method of claim 23, wherein the interferometric metrology tool comprises a laser-sustained plasma source.

34. The overlay metrology method of claim 23, wherein the grating-over-grating structure is associated with two or more at least partially overlapping lithographic exposure fields on different layers.

35. The overlay metrology method of claim 34, wherein the grating-over-grating structure comprises:
one or more patterned elements on a first layer formed from a first lithographic exposure field and one or more additional processing steps; and
one or more lithographically-exposed features in a second layer formed from a second lithographic exposure, wherein the second layer is a resist layer.

36. The overlay metrology method of claim 34, wherein the grating-over-grating structure comprises:
one or more patterned elements on a first layer formed from a first lithographic exposure field; and
one or more patterned elements in a second layer formed from a second lithographic exposure.

37. The overlay metrology method of claim 23, wherein the grating-over-grating structure is associated with two or more at least partially overlapping lithographic exposure fields on a common layer.

* * * * *